(12) United States Patent
Sung et al.

(10) Patent No.: US 7,123,056 B2
(45) Date of Patent: Oct. 17, 2006

(54) CLOCK LOGIC DOMINO CIRCUITS FOR HIGH-SPEED AND ENERGY EFFICIENT MICROPROCESSOR PIPELINES

(75) Inventors: Raymond Jit-Hung Sung, Edmonton (CA); Duncan George Elliott, Edmonton (CA)

(73) Assignee: Mosaid Technologies Incorporated, Kanata (CA)

(*) Notice: Subject to any disclaimer, the term of this patent is extended or adjusted under 35 U.S.C. 154(b) by 94 days.

(21) Appl. No.: 10/730,002

(22) Filed: Dec. 9, 2003

(65) Prior Publication Data

US 2004/0164769 A1 Aug. 26, 2004

Related U.S. Application Data

(60) Provisional application No. 60/431,731, filed on Dec. 9, 2002.

(51) Int. Cl.
*H03K 19/096* (2006.01)
(52) U.S. Cl. .......................................... 326/97; 326/98
(58) Field of Classification Search ............ 326/95–98; 365/203
See application file for complete search history.

(56) References Cited

U.S. PATENT DOCUMENTS

| | | | | |
|---|---|---|---|---|
| 3,857,045 A | * | 12/1974 | Low et al. | 326/97 |
| 3,999,081 A | * | 12/1976 | Nakajima | 326/97 |
| 5,426,383 A | * | 6/1995 | Kumar | 326/119 |
| 6,265,899 B1 | * | 7/2001 | Abdel-Hafeez et al. | 326/96 |

* cited by examiner

*Primary Examiner*—James H. Cho
(74) *Attorney, Agent, or Firm*—Anne Kinsman; Borden Ladner Gervais LLP

(57) ABSTRACT

A systematic method for single-rail domino logic circuits is provided, in which inverting and non-monotonic logic functions can be integrated into a pipelined system with almost zero overhead. This logic family, called Clock Logic (CL)-domino is functionally complete while tolerating skew and minimizing the number of clock phases that must be distributed. Simulation results for a CL-domino ALU at 1-GHz under high skew (1-FO4) conditions, shows a power reduction of 41% over the same ALU implemented in dual-rail skew-tolerant domino logic. This power reduction incurs no performance penalty over dual-rail techniques, although in some cases additional design effort is required.

7 Claims, 15 Drawing Sheets

Figure 21

| 12a | 12b | 12c | 12a | 12b |

$\phi_1+\phi_2$ | $\phi_2+\phi_3$ | $\phi_3$ | $\phi_1$

Monotonic Dynamic | Static | Non-monotonic Dynamic | Static | Non-monotonic Dynamic | Static | Monotonic Dynamic | Static $\phi_1$ 6a | $\phi_2$ 6b | $\phi_3$ 6c | $\phi_1$ 6a Phase 1 | Phase 2 | Phase 3 | Phase 1

Figure 22

| 12a | 12b | 12c | 12a | 12b |

$\phi_1$ | $\phi_2$ | $\phi_3$ | $\phi_1$

Monotonic Dynamic | Static | Non-monotonic Dynamic | Static | Non-monotonic Dynamic | Static | Monotonic Dynamic | Static $\phi_1$ 6a | $\phi_1 \cdot \phi_2$ 6b | $\phi_2 \cdot \phi_3$ 6c | $\phi_1$ 6a Phase 1 | Phase 2 | Phase 3 | Phase 1

Figure 23

| 12a | 12b | 12c | 12a | 12b |

$\phi_1+\phi_2$ | $\phi_2$ | $\phi_3$ | $\phi_1$

Monotonic Dynamic | Static | Non-monotonic Dynamic | Static | Non-monotonic Dynamic | Static | Monotonic Dynamic | Static $\phi_1$ 6a | $\phi_2$ 6b | $\phi_2 \cdot \phi_3$ 6c | $\phi_1$ 6a Phase 1 | Phase 2 | Phase 3 | Phase 1

CLOCK LOGIC DOMINO CIRCUITS FOR HIGH-SPEED AND ENERGY EFFICIENT MICROPROCESSOR PIPELINES

CROSS-REFERENCE TO RELATED APPLICATIONS

This application claims the benefit of priority under 35 U.S.C. 119(e) to the filing date of U.S. Provisional Application No. 60/431,731, filed Dec. 9, 2002.

MICROFICHE APPENDIX

Not Applicable.

TECHNICAL FIELD

The present invention relates to domino logic circuits, and in particular to clock logic domino circuits for high-speed and energy efficient microprocessor pipelines.

BACKGROUND OF THE INVENTION

During the past three decades, the power consumption of integrated circuits, including microprocessors, has been increasing at an exponential rate. This steady increase in power dissipation is the result of several factors. First, the number of transistors and the transistor density has doubled about every 24 months. However, the power efficiency of micro-architectures, measured by MIPS/Watt, degrades considerably as more superscalar features are built into a design. Second, the use of more complex circuit techniques has allowed clock frequencies to increase faster than pure process scaling would suggest; often at the expense of increased power. Third, aggressive transistor technologies with higher current carrying capabilities and lower threshold voltages have increased switching speeds at the expense of significant sub-threshold leakage current. Last, improvements in compilers and software applications have also increased the switching activity within a microprocessor.

If this trend continues, it is expected that the power consumption of typical microprocessors may be several thousand Watts by 2008. This presents an enormous challenge in the design of the power distribution networks needed to carry the large currents and also in the verification of digital noise immunity. Furthermore, these predicted power levels are prohibitively large from a reliability and system cost perspective. Also, from a system performance standpoint, high power dissipation limits the scalability in the number of processors that can be incorporated into a system and the number of cores on a single die. From this discussion, it becomes clear that total power consumption will eventually become a limiting factor to increased chip integration.

Despite the power dilemma, designers are still most concerned about speed performance because, in most cases, that is what determines whether a system is successful. For most microprocessors incorporating advanced superscalar micro-architectures, this has resulted in the use of dynamic domino logic.

Dynamic logic is a digital circuit design technique used in some high-performance integrated circuits. In contrast to the more popular logic family known as static CMOS, dynamic logic circuits are faster, because they present much lower input capacitance for the same output current and have a lower switching threshold. Unfortunately, dynamic circuits are more susceptible to noise than static CMOS. They also dissipate more power than their static counterparts because of their higher activity factors and significant clock loading. However, in many circumstances they have proven to be the only circuit family able to meet the demands of reduced cycle times.

Domino logic gates are a popular dynamic logic family, in which an inverting static gate is inserted between successive dynamic gates. Standard domino logic inserts an inverter between the dynamic gates while compound domino logic inserts multiple input complementary gates. The dynamic/static gate pair is known as a domino gate, although it is in fact constructed from two gates. A series of connected domino gates precharge simultaneously as if setting up a set of dominos. During evaluation, the first dynamic gate falls causing the static gate to rise which then causes the next dynamic gate to fall and its static gate to rise, much like a chain of toppling dominos. It is common practice in domino logic design to divide a pipeline 2 of series-connected domino gates 4 into "cells" 6 each of which is controlled by a respective clock phase Φ, as may be seen in FIG. 1. Each cell 6 may contain one or more dynamic logic gates 8. As may also be seen in FIG. 1, cells 6a controlled by clock phase Φ1 may be referred to as "phase 1 logic"; cells 6b controlled by clock phase Φ2 may be referred to as "phase 2 logic", and cells 6c controlled by clock phase Φ3 may be referred to as "phase 3 logic".

Domino logic circuits are often used in microprocessor critical paths because of their 1.5 to 2 times speed improvement over static CMOS gates. Despite their wide application to microprocessor design, conventional single-rail domino is not functionally complete because of its inability to perform inversions. There are many situations where inverting or non-monotonic logic needs to be used in conjunction with non-inverting/monotonic logic. These include multiplexers, parity circuits, and arithmetic units which depend heavily on XOR and XNOR functions. However, if inverting functions (some inputs to the first dynamic gate of a logic cell 6 are complemented) or non-monotonic functions are used inside a domino pipeline 2 with multi-phase clocks, the inverting or non-monotonic functions will be corrupted when the previous cell precharges. For example, in FIG. 1, the inverting gate 8 in the phase 2 logic 6b will be corrupted when the phase 1 logic 6a precharges; and likewise the inverting gate 8 in the phase 3 logic 6c will be corrupted when the phase 2 logic 6b precharges. This is because an inverting function of the previous logic cell 6 might, for example, cause a 0→1 transition on the input of the current cell in the middle of the evaluate cycle, where the input to the current cell 6 should have remained at 0 (as it was at the start of the evaluate cycle). This is illustrated in FIG. 2 for the case of two AND gates 10a, 10b in adjacent phase logic cells 6, where, one of the inputs to the second AND gate 10b is complemented. In the case of a non-monotonic function, the inputs to the dynamic gate 10b will change before the end of the current evaluate cycle and the output might no longer maintain the correct result. Such a logic function, where an inversion exists at the input of a dynamic gate or the gate implements non-monotonic logic, will hereafter be referred to as an input complemented or non-monotonic dynamic logic function.

Consequently, circuit designers must use slower logic circuits such as static CMOS or transmission gates to implement inverting and non-monotonic functions with the additional cost of increased overhead to interface from dynamic to static logic and back. Clock-blocking techniques that require the clock to be the last input signal to arrive at a dynamic gate after the data inputs, so that non-inverting and monotonic functions are possible, have also been used.

As an example of such clock-blocking techniques is known as clock-delayed (CD)-domino. However, these clock-blocking techniques require precise matching of data and clock delays, which have to be accounted for under all possible process and environmental conditions. Furthermore, clock skew must be budgeted at each clock-blocking gate, making this logic family skew-intolerant. Last, scaling of such designs would normally require complete re-verification of the data and clock delay paths.

For designs where speed is the most critical design parameter, Domino Dynamic Cascade Voltage Switch Logic (DCVSL)/dual-rail domino circuits can be used to meet the requirements for inverting and non-monotonic functions. Such circuits require approximately double the number of transistors compared to single-rail domino logic, resulting in greatly increased routing complexity, circuit area and in many cases, decreased circuit speed due to longer differential routing lines.

Since domino circuits are synchronized by clocks, clock skew can have a significant impact on domino circuit performance. Skew tolerant domino circuits have been shown to alleviate the effects of skew on the performance of traditional domino circuits.

Skew-tolerant domino circuits remove the three sources of sequencing overhead found in traditional latch-based domino pipelines: clock skew, latch overhead and pipeline imbalances. This is accomplished by supplying overlapping clock phases to different stages of domino logic. The use of overlapping clock phases eliminates the need to budget clock skew in the cycle time, since data can now arrive and depart from different pipeline stages irrespective of modest variations in the arrival time of the clock signals. Furthermore, since the overlapping clock phases allow time for the first domino gate 4 of a logic cell 6 to evaluate before the last gate 4 of the previous cell 6 precharges, latches are eliminated from the pipeline 2 as domino gates 4 inherently function as latches. Finally, if the overlap between clock phases is larger than the worst-case clock skew, then domino gates can "time borrow" across stages. Gates 4 in two adjacent cells 6 can evaluate when their respective clocks are high and overlap, allowing gates that nominally evaluate during a first clock phase to run late into a second clock phase. Thus, removing all the sources of overhead allows the entire cycle time to be available for useful computation.

While many of the design difficulties concerning noise and delay performance of dynamic logic have been addressed in the prior art, practical power considerations have often been ignored. In practice, dynamic logic dissipates more power than static logic, mainly due to its increased switching activity resulting from periodic precharge and discharge operations. Additionally, the use of keeper devices to solve problems due to charge leakage, also tends to increase the transistor count and thus the switched capacitance, with an attendant increase in power consumption. Furthermore, dual-rail domino circuits dissipate more power (approximately double) than single-rail domino because of their increased routing capacitance and unity activity factor.

Accordingly, techniques for reducing the power consumption of domino logic circuits remain highly desirable.

SUMMARY OF THE INVENTION

An object of the present invention is to provide a domino logic circuit suitable for high speed operation, with low power consumption Accordingly, an aspect of the present invention provides a single-rail domino circuit driven in accordance with a multi-phase clock. The domino circuit comprises a first dynamic logic gate, and a clock logic circuit connected to the first dynamic logic gate. The clock logic circuit comprising respective first and second transistors connected to perform a logical function of respective phases of the multiphase clock.

A further aspect of the present invention provides a single-rail domino circuit driven in accordance with a multi-phase clock. The domino circuit comprises a plurality of logic phases connected in series. Each logic phase is associated with a respective current clock phase and comprising at least one dynamic logic gate. A respective clock logic circuit is connected to each dynamic logic gate. Each clock logic circuit includes respective first and second transistors connected to perform a logical function of the respective current clock phase and an adjacent clock phase. As a result, overlap between a precharge cycle of a first logic phase and an evaluation cycle of an adjacent logic phase is prevented.

BRIEF DESCRIPTION OF THE DRAWINGS

Further features and advantages of the present invention will become apparent from the following detailed description, taken in combination with the appended drawings, in which:

FIG. 21 schematically illustrates OR-precharge clock timing in consecutive phases of non-monotonic domino logic in accordance with the present invention;

FIG. 22 schematically illustrates AND-evaluate clock timing in consecutive phases of non-monotonic domino logic in accordance with the present invention;

FIG. 23 schematically illustrates OR-precharge clock timing followed by AND-evaluate in consecutive phases of non-monotonic domino logic in accordance with the present invention;

It will be noted that throughout the appended drawings, like features are identified by like reference numerals.

DETAILED DESCRIPTION OF THE PREFERRED EMBODIMENT

The present invention provides techniques for designing domino logic circuits which minimize power consumption while maintaining substantially equal delay performance when compared to existing comparable circuits. The logic family of the present invention, which is referred to herein as Clock Logic (CL)-Domino, attains low power consumption because it is single-rail logic that is functionally complete, unlike skew-tolerant domino or other domino logic styles that employ dual-rail gates for logic completeness. Second, CL-domino attains delay performance similar to conventional dual-ended logic styles because it masks most of the clock skew overhead, much like skew-tolerant domino, while reducing wire delays.

Clock logic (CL)-domino is built upon the observation that the clocks used to precharge and evaluate a dynamic gate need not be the same. Instead, logic functions derived from multiple-phase clocks can be used for separately precharging and evaluating domino logic stages. By adhering to certain rules based on those derived previously for skew tolerant domino circuits, entire microprocessor critical loops can be built in single-rail dynamic logic that supports skew-tolerance and time-borrowing, thus saving circuit area and power while minimizing circuit delay due to reduced wiring parasitics. As will be described in greater detail below, these asymmetric clocks can be generated at the transistor level at each domino gate.

In general, the present invention provides a family of clock-logic (CL) functions for driving the operation of single-rail domino pipelines. The CL functions operate to prevent overlap between the precharge of one logic cell, and evaluation of an adjacent cell. Two primary clock logic functions are used for this purpose, namely: OR-precharge; and AND-evaluate. In OR-precharge, the precharge of the, previous cell 6 is delayed until the end of the evaluation period of the current cell 6. This can be accomplished by controlling the precharge of each cell using precharge clocks obtained by computing a logical-OR function of conventional multiphase clock signals. In AND-evaluate, the evaluation of a logic cell is terminated early. This can be accomplished by controlling the evaluate cycle of each cell using evaluate clocks obtained by computing a logical-AND function of conventional multiphase clock signals.

OR-precharge and AND-evaluate CL functions can be used together, and/or singly in combination with conventional domino control clocks, to develop a family of CL-domino logic pipelines, depending on the desired performance characteristics. For the purposes of illustration of the present invention, six embodiments will be described below, namely: OR-Precharge/Domino-Evaluate; Domino-Precharge/AND-Evaluate; OR-Precharge/AND-Evaluate; OR-Precharge/OR-Evaluate; Dynamic Cascaded OR-Precharge/Domino-Evaluate; and Dynamic Cascaded Domino-Precharge/AND-Evaluate.

OR-Precharge/Domino-Evaluate

Figure 1:
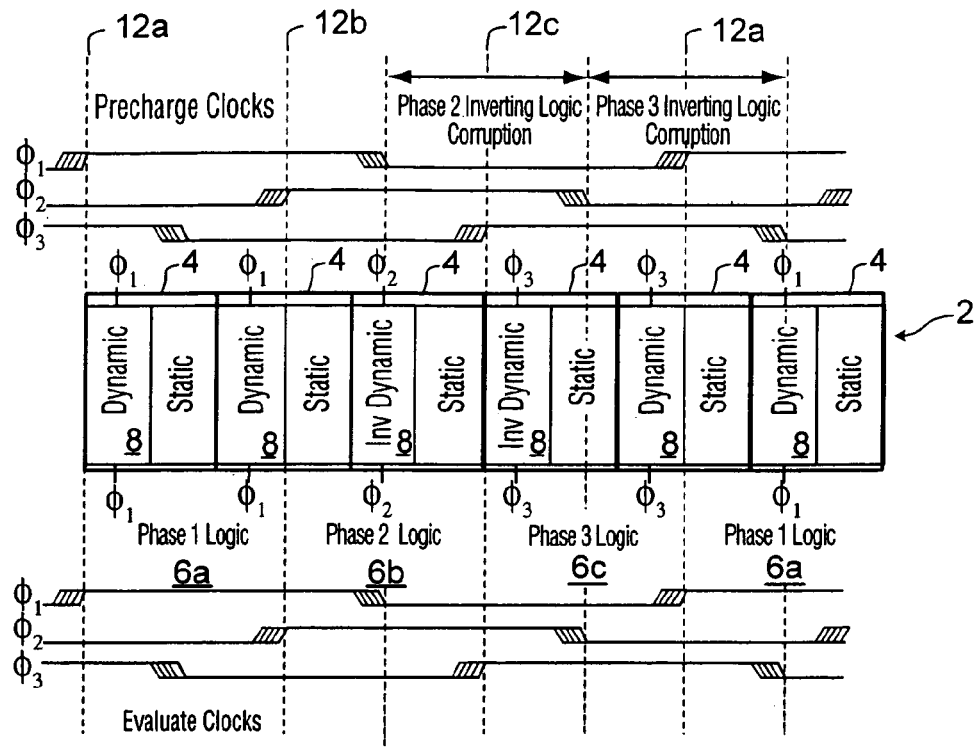
FIG. 1 schematically illustrates clock signals for driving a prior art domino logic pipeline.
Figure 2:
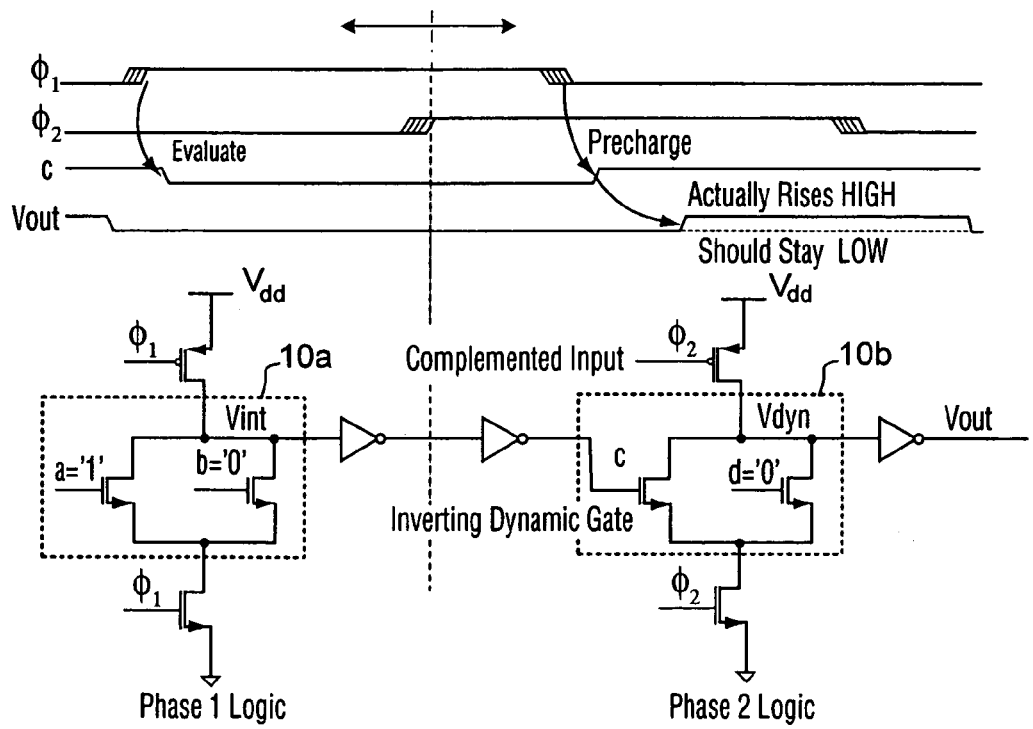
FIG. 2 illustrates an operation of a prior art domino logic pipeline that yields erroneous results.
Figure 3:
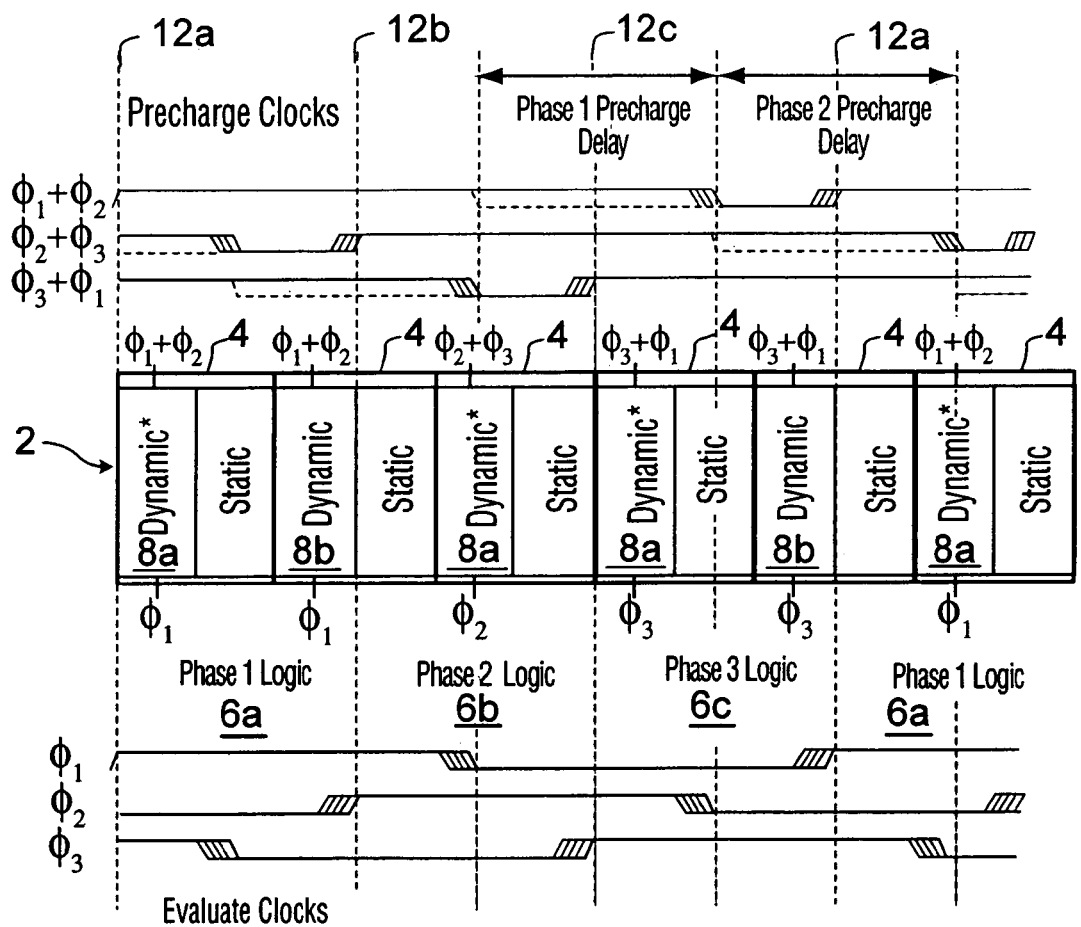
FIG. 3 schematically illustrates clock signals for driving a domino logic pipeline in accordance with a first embodiment of the present invention.

A first embodiment of the present invention provides a single-rail domino pipeline 2 in which the precharge of a previous phase logic cell 6 is delayed until the end of the evaluation period of the current phase cell 6. This can be accomplished through extending the duty-cycle of the precharge clocks in the previous phase cell up until the time that the evaluation period for the current phase ends and its evaluation clock goes low, as shown in FIG. 3, where "Dynamic*", gates 8a implement any of an input complemented function, a non-monotonic function, or a standard dynamic logic function. "Dynamic" gates 8b, on the other hand, implement a known dynamic logic function. This first embodiment of Clock-Logic domino is referred to as "OR-Precharge/Domino-Evaluate" since the precharge clocks are a logical OR function of the precharge/evaluate clocks used in conventional skew-tolerant domino logic.

Inverting or non-monotonic functions can only be placed at the cell boundaries 12 since the remaining dynamic gates 8 in a cell 6 must still only make a monotonic 0→1 transition during its evaluation period. Furthermore, if the Dynamic* gate 8a implements an input complemented or non-monotonic function, the previous phase logic must finish evaluation (be stable) by the time the Dynamic* evaluation clock rises, thus imposing a hard edge on the data, much like the setup time required for flip-flops. Therefore, when clock skew is accounted for, the previous phase logic cell has a logic evaluation constraint of:

$$t_{eval\ prev} \leq \frac{T_c}{N} - t_{skew} \qquad \text{(Equ. 1)}$$

It should be noted that only the cell before a input complemented Dynamic* gate 8a has this evaluation constraint. This is another way of stating that the previous phase cell 6 cannot borrow time from a cell 6 that implements an input complemented function. Furthermore, a skew penalty must be paid by an input complemented or nonmonotonic function at the cell boundary 12. Skew-tolerance and time borrowing, however, can occur normally, as in skew-tolerant domino, if the Dynamic* gate 8a implements a normal dynamic logic function.

Since the precharge clock duty-cycle has been increased from its nominal value, there is less time for the domino gates to precharge. The direction of the skew between two adjacent clock phases $\Phi_2$ with respect to $\Phi_1$ affects precharge times as follows: negative skew gives the $\Phi_2$ logic less time to precharge while giving the $\Phi_1$ logic more time to precharge and positive skew gives the $\Phi_2$ logic more time to precharge and the $\Phi_1$ logic less time to precharge. For simplicity, both directions of skew effectively reduce the available precharge time by $T_c/N$. The maximum skew tolerable decreases to:

$$t_{skew\ max\ OR\ pre} = \frac{\frac{N-2}{N}T_c - t_{hold} - t_{pretch}}{2} \quad \text{(Equ. 2)}$$

The minimum number of cells 6 in OR-precharge CL-domino logic is three, so that the required number of precharge clocks are generated. For the case of exactly one domino gate 4 per cell 6, the maximum tolerable skew is:

$$t_{skew\ max\ OR\ pre} = \frac{\frac{N-1}{N}T_c - t_{hold} - t_{prech}}{2} \quad \text{(Equ. 3)}$$

Considering global and local clock domains, the maximum global skew tolerable decreases to:

$$t_{skew\ max\ global\ OR\ pre} = \frac{N-2}{N}T_c - t_{hold} - t_{prech} - t_{skew\ local} \quad \text{(Equ. 4)}$$

The maximum time available for time borrowing does not change from that of conventional domino logic, since the evaluation is unaffected by the change in the precharge clocks. However, the time available for time-borrowing, while trading off skew-tolerance and taking into account global and local clock domains is reduced to:

$$t_{borrow\ OR\ pre} = \frac{N-2}{N}T_c - t_{hold} - t_{prech} - t_{skew\ local} - t_{skew\ global} \quad \text{(Equ. 5)}$$

In regards to race through or min-delay failure, conventional time limitations still hold, since the evaluate clocks remain unchanged from normal skew-tolerant domino logic. However, for domino systems clocked strictly with OR-precharge, the system will fail due to a violated precharge time constraint, as described above, before it will fail due to any racethrough conditions.

Domino-Precharge/AND-Evaluate

Figure 4:
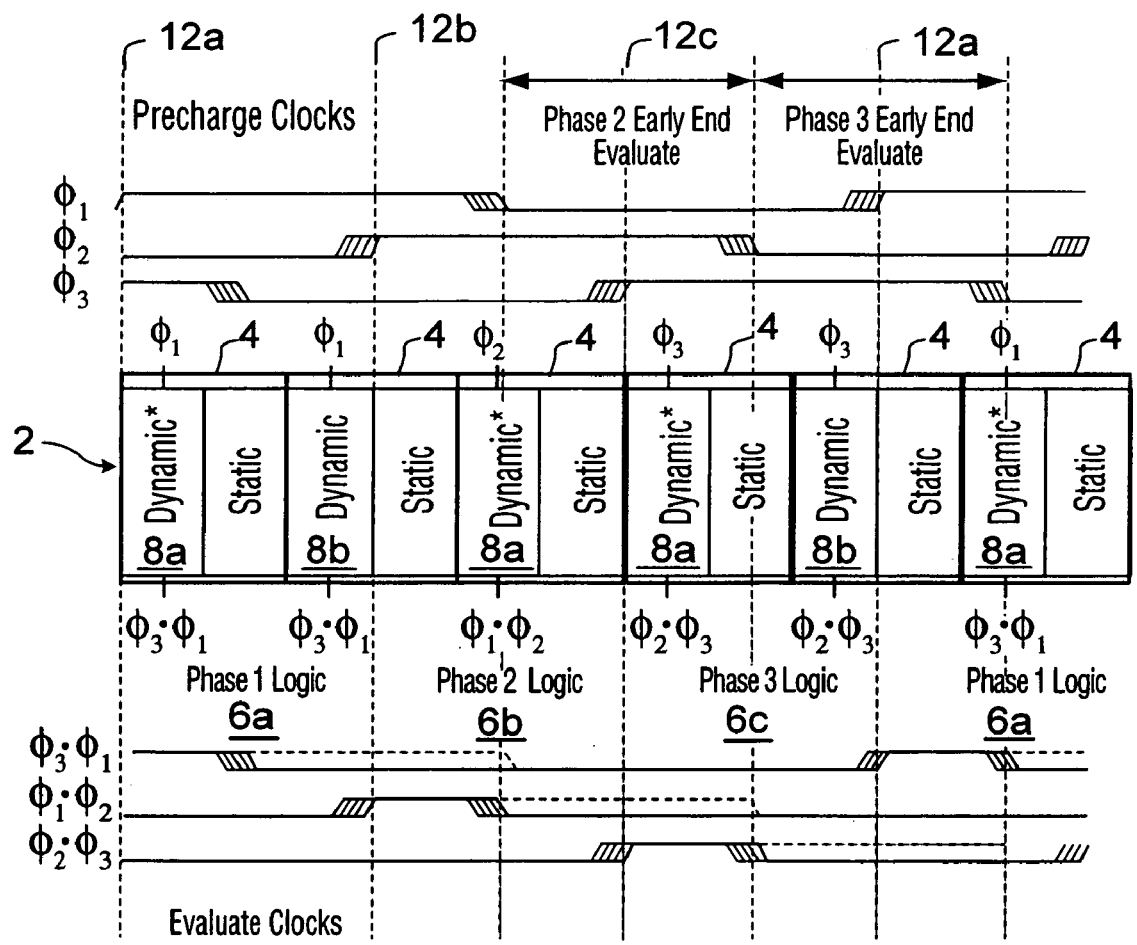
FIG. 4 schematically illustrates clock signals for driving a domino logic pipeline in accordance with a second embodiment of the present invention.

A second embodiment of the present invention provides single-rail domino pipelines in which the evaluation of a cell is terminated early. This can be accomplished by limiting the period of evaluation from the time that the current phase clock is driven high until the time that the previous phase clock is driven low, as shown in FIG. 4, where the "Dynamic*" gates 8a implement any of an input complemented function, a non-monotonic function, and a standard dynamic logic function. The "Dynamic" gates 8b on the other hand implement a standard dynamic logic function. This second embodiment is referred to as Clock-Logic domino "Domino-Precharge/AND-Evaluate" since the evaluate clocks are a logical AND function of the precharge/evaluate clocks used in prior art skew-tolerant domino logic.

The constraint that input complemented or non-monotonic functions be placed only at cell boundaries 12 applies for AND-evaluate as well as for OR-precharge. The constraint that the previous cell complete evaluation before a rising edge of an input complemented or non-monotonic Dynamic* gate 8a is enforced automatically, because evaluation ends early. The nominal evaluate time for a cell of CL-domino logic is equal to:

$$t_{AND\ eval\ cycle} = t_e - \frac{T_c}{N} - 2t_{skew} \quad \text{(Equ. 6)}$$

This is less than the nominal evaluate time for a cell of skew-tolerant domino logic without time borrowing, i.e.

$$\frac{T_c}{N} - t_{skew}.$$

Furthermore, time-borrowing cannot occur for CL-domino gates that are clocked strictly by AND-evaluation, even if the Dynamic* gate 8a implements a standard dynamic logic function. However, for practical designs, AND-evaluate will never be used exclusively without also incorporating other CL-domino or skew-tolerant domino circuits, thus alleviating the evaluation time and non-time borrowing penalties. Thus the only important constraint is that no time can be borrowed from AND-Evaluate Dynamic* gates 8a that implement input complemented or non-monotonic functions.

Since the evaluate clock duty-cycle has been decreased from its nominal value, there is less time for the domino gates 4 to evaluate. The direction of the skew between two adjacent clock phases $\Phi_2$ with respect to $\Phi_1$ affects evaluate times as follows: negative skew gives the $\Phi_2$ logic more time to evaluate while giving the $\Phi_3$ logic less time to evaluate, and positive skew gives the $\Phi_2$ logic less time to evaluate and the $\Phi_3$ logic more time to evaluate. Clock skew will eventually cause a CL-domino AND-evaluate stage to fail when there is no overlap between adjacent clock phases. Therefore, the maximum tolerable skew is:

$$t_{skew\ max\ AND\ eval} = \frac{\frac{N-1}{N}T_c - t_{hold} - t_{prech}}{2} \quad \text{(Equ. 7)}$$

It should be noted that this is the same equation that was derived for conventional skew-tolerant domino logic.

The minimum number of cell phases 6 in CL-domino AND-evaluate domino logic is three, so that the required number of evaluate clocks are generated and the results passed down through the logic stages.

For the case of exactly one domino gate 4 per cell 6, the maximum tolerable skew is:

$$t_{skew\ max\ AND\ eval} = \frac{T_c - t_{hold} - t_{prech}}{2} \quad \text{(Equ. 8)}$$

Again, this is the same limit as that of conventional skew-tolerant domino logic. When comparing OR-precharge with AND-evaluate techniques, AND-evaluate offers more skew tolerance because the precharge operation to the dynamic gates 8 is unaffected. However, the amount of useful time per cycle is reduced from that of OR-precharge.

As is the case for conventional skew-tolerant domino logic, reducing the local skew can be used to increase the maximum tolerable global skew according to:

$$t_{skew\ max\ global\ AND\ eval} = \frac{N-1}{N}T_c - t_{hold} - t_{prech} - t_{skew\ local} \qquad \text{(Equ. 9)}$$

As mentioned previously, time borrowing cannot occur across phase boundaries 12 for CL-domino gates clocked strictly by AND-evaluate. However, as will be described in greater detail below, this constraint may be relaxed for more general CL-domino pipelines. A min-delay condition can occur if a rising edge of a first clock phase results in three consecutive clock phases being driven high simultaneously. This occurs under the same conditions as that for conventional skew-tolerant domino logic. In the case of AND-evaluate, failure due to min-delay will occur first before a violated precharge time constraint.

OR-Precharge/AND-Evaluate

Figure 5:
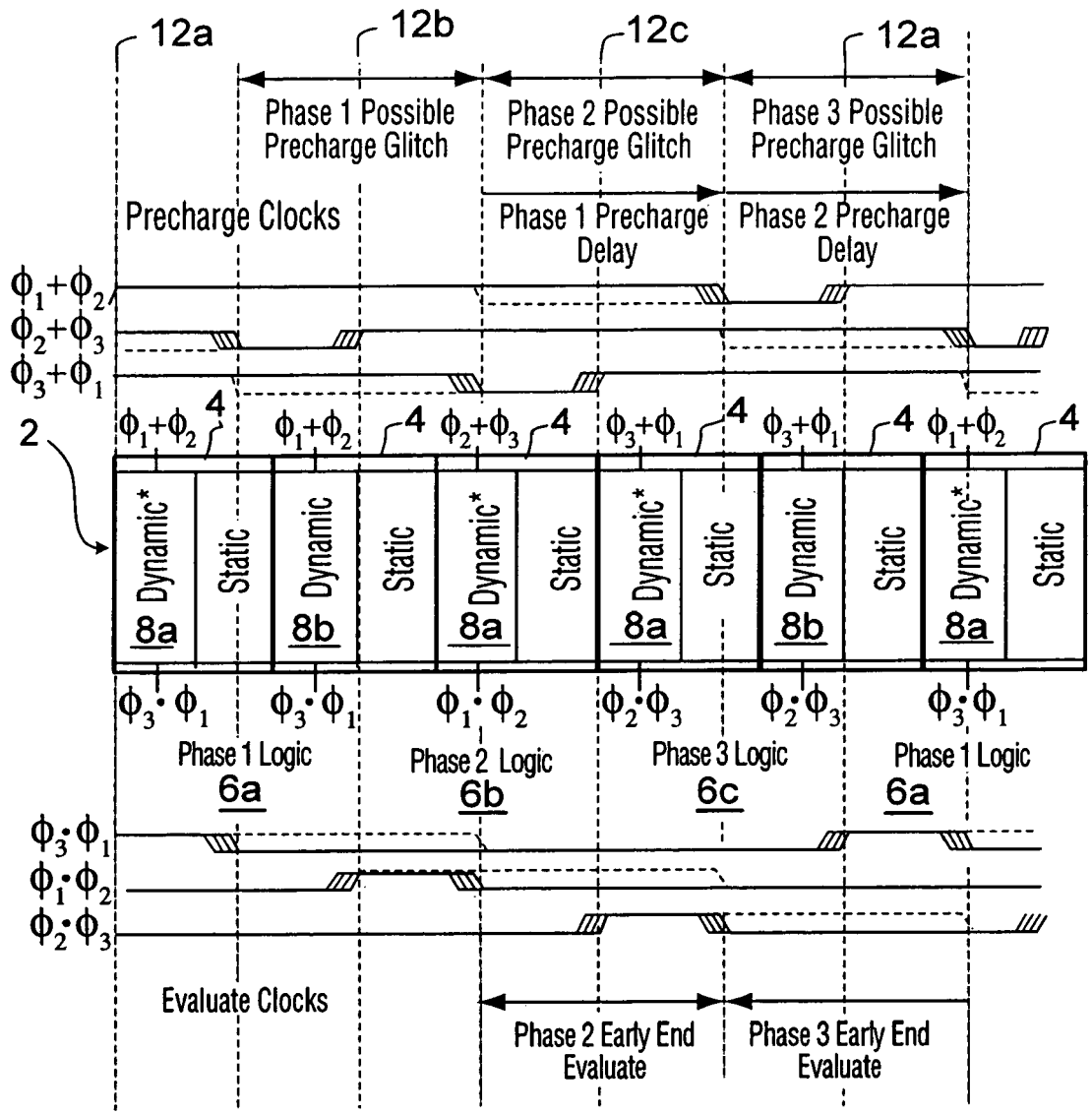
FIG. 5 schematically illustrates clock signals for driving a domino logic pipeline in accordance with a third embodiment of the present invention.

A third embodiment of CL-domino combines OR-precharge with AND-evaluate to eliminate spurious transitions on the inputs of input-complemented or non-monotonic functions, when a domino gate 4 is holding the evaluated data and doing no useful work. Spurious input transitions can cause charge-sharing which may result in a change of the evaluated logic state. Unwanted input transitions can occur for domino-precharge/AND-evaluate when the previous cell 6 is precharging and the current cell 6 has finished evaluating thus leaving the output floating high. An example implementation of "OR-precharge/AND-evaluate" is shown in FIG. 5.

Since this style of CL-domino combines OR-precharge with AND-evaluate, the equations noted above for the skew-tolerance of OR-precharge and AND-evaluate are applicable. Therefore, the constraints on skew tolerance for OR-precharge/Domino-evaluate apply.

Furthermore, as for AND-evaluate, time borrowing cannot occur across phases for CL-domino gates clocked strictly by OR-precharge/AND-evaluate. However, as will be described below, this constraint may be relaxed for more general CL-domino pipelines. A min-delay condition can occur if a rising edge of a first clock phase results in three consecutive clock phases being high simultaneously. This occurs under the same conditions as that for conventional skew-tolerant domino logic.

OR-Precharge/OR-Evaluate

Figure 6:
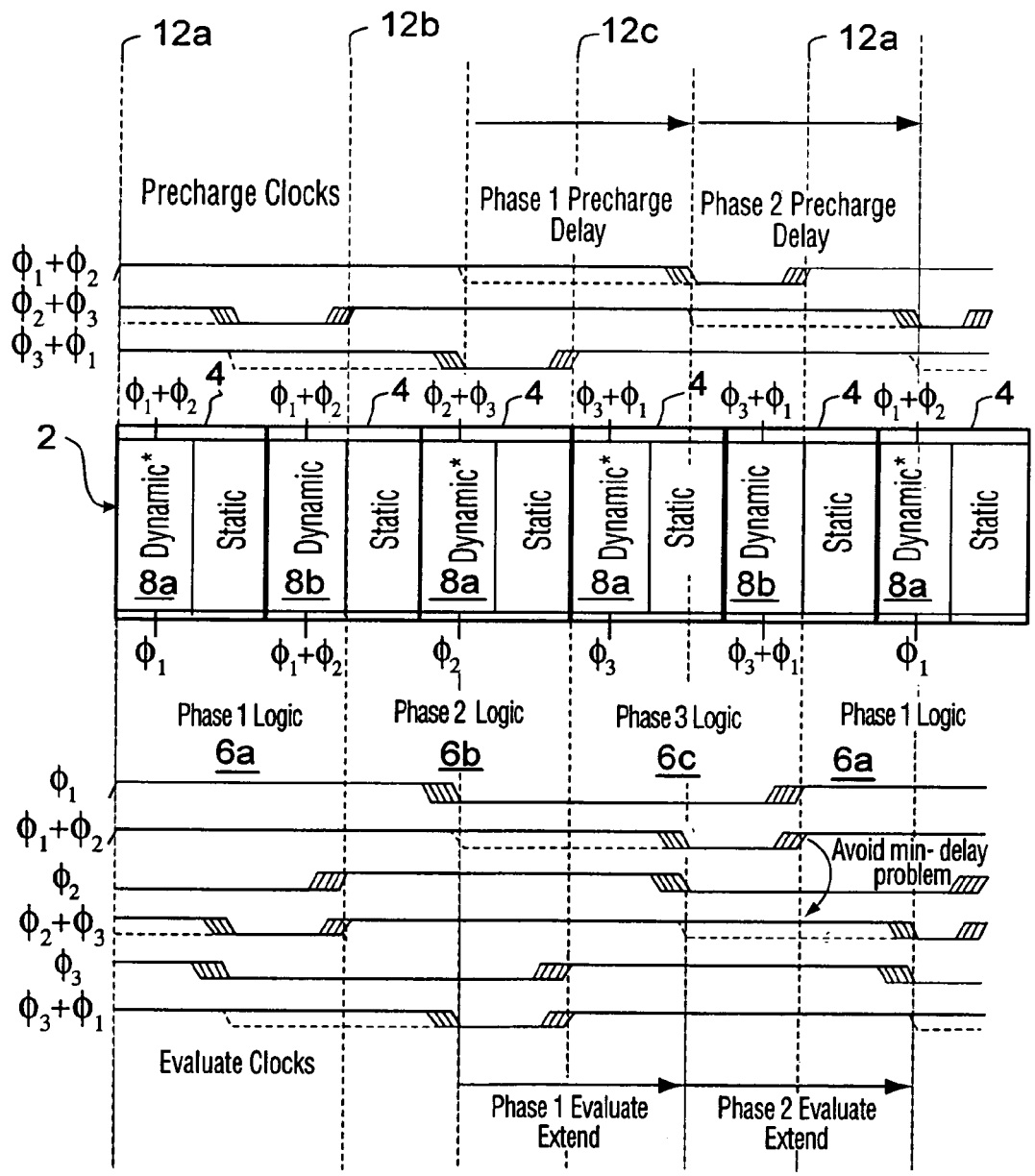
FIG. 6 schematically illustrates clock signals for driving a domino logic pipeline in accordance with a fourth embodiment of the present invention.

A fourth embodiment of CL-domino takes advantage of the fact that the precharge operation for a cell 6 of domino logic occurs for all dynamic gates 8 in parallel while evaluation happens in series. Because series evaluation is usually the critical path, it is reasonable to allocate a larger portion of the cycle for evaluation. This means that the duty cycle of the evaluate clocks should be increased. However, it is known that evaluate clocks with large duty cycles will often fail due to min-delay failures. Conversely, long duty cycle clocks will not be able to tolerate much skew or afford much time-borrowing. A technique for using extra non-overlapping clocks to the first domino gate of each cell is shown for CL-domino in FIG. 6.

The extra clocks, denoted by $\Phi_1 \rightarrow \Phi_3$, may be the same clocks used in conventional skew-tolerant domino, and the extended evaluate clocks are the logical OR of two consecutive clock phases. This fourth embodiment is referred to as Clock-Logic domino "OR-Precharge/OR-Evaluate", since the precharge/evaluate clocks, with the exception of the extra clocks, are a logical OR of the precharge/evaluate clocks used in conventional skew-tolerant domino logic.

As in previous embodiments, the Dynamic* gates 8a can implement any of an input complemented function, a non-monotonic function, or a standard dynamic logic function. "Dynamic" gates 8b, on the other hand, implement a standard dynamic logic function.

The constraint that input-complemented or non-monotonic functions be placed only at the cell boundaries 12 applies as before. Any cell 6 before an input-complemented or nonmonotonic Dynamic* gate 8a cannot borrow time from that cell 6. There is no need to delay the extended (OR-evaluate) clocks from the extra clocks after the first gates, since the extended clocks are directly derived from the extra clocks using the clock logic circuits at each gate 8. This means that min-delay problems cannot happen between the extra clocks and the extended clocks. Furthermore, only the extra clocks have to be distributed from a local clock generator, thus reducing the complexity of the clock generator and distribution network. Most importantly, this CL-domino method eliminates dead space between the first gate 8 of the cell and the later gates 8, where logic might possibly wait for the delayed clock.

Since the evaluate duty-cycle has been increased, there is more time for the domino gates 4 to evaluate or equivalently, the current cell 6 can allocate more slack time to the previous cell 6 so that the previous cell 6 can borrow more time from the current cell 6. The direction of the skew between two adjacent clock phases, $\Phi_2$ with respect to $\Phi_1$, affects evaluate times as follows: negative skew gives the $\Phi_1$ logic less time to evaluate while giving the $\Phi_2$ logic more time to evaluate and positive skew gives the $\Phi_1$ logic more time to evaluate and the $\Phi_2$ logic less time to evaluate.

Since the precharge duty-cycle has also been increased, there is less time for the domino gates 4 to precharge. The direction of the skew between two adjacent clock phases $\Phi_2$ with respect to $\Phi_1$ affects precharge times as follows: negative skew gives the $\Phi_2$ logic less time to precharge while giving the $\Phi_1$ logic more time to precharge and positive skew gives the $\Phi_2$ logic more time to precharge and the $\Phi_1$ logic less time to precharge.

In regards to precharge and evaluate constraints, the equations derived for OR-precharge/Domino-evaluate apply, because the precharge of the domino gates is unchanged from that embodiment and the OR of the evaluation clocks does not affect those constraints.

However, for cells in which the Dynamic* gate 8a implements a standard dynamic logic function, the maximum time that can be borrowed from the next cell is increased to:

$$t_{borrow\ max\ OR\ pre\ OR\ eval} = T_e - t_{skew} \qquad \text{(Equ. 10)}$$

The extra time available for time-borrowing helps to alleviate design difficulties and reduced cycle times associated with imbalanced pipeline stages in high-speed designs. The min-delay constraint of conventional domino logic still holds, even though the duty-cycle of the clocks is effectively increased. This is a result of the extended clocks being directly derived from the normal clocks. However, a system clocked strictly by OR-precharge/OR-evaluate will fail due to a violated precharge time constraint before it will fail due to any racethrough condition.

Dynamic Cascaded OR-Precharge/Domino-Evaluate

Dynamic gates 8 that are directly coupled to each other with no intervening static logic predate the popularity of CMOS circuits. A fifth embodiment of CL-domino which uses OR-precharge for all single-rail domino pipelines, is called "Dynamic Cascaded OR-Precharge/Domino-Evaluate" and is shown in FIG. 7.

Dynamic gates 8 can be placed back-to-back at cell boundaries 12 without an intervening static gate, provided that the logic of a current cell finishes before a next phase begins. Since it has been established above that time cannot be borrowed from a cell that implements an input complemented or non-monotonic function in any case, cascading dynamic gates 8 directly will result in better performance in some situations since the pipeline will contain more dynamic gates 8 in the critical path.

Figure 7:
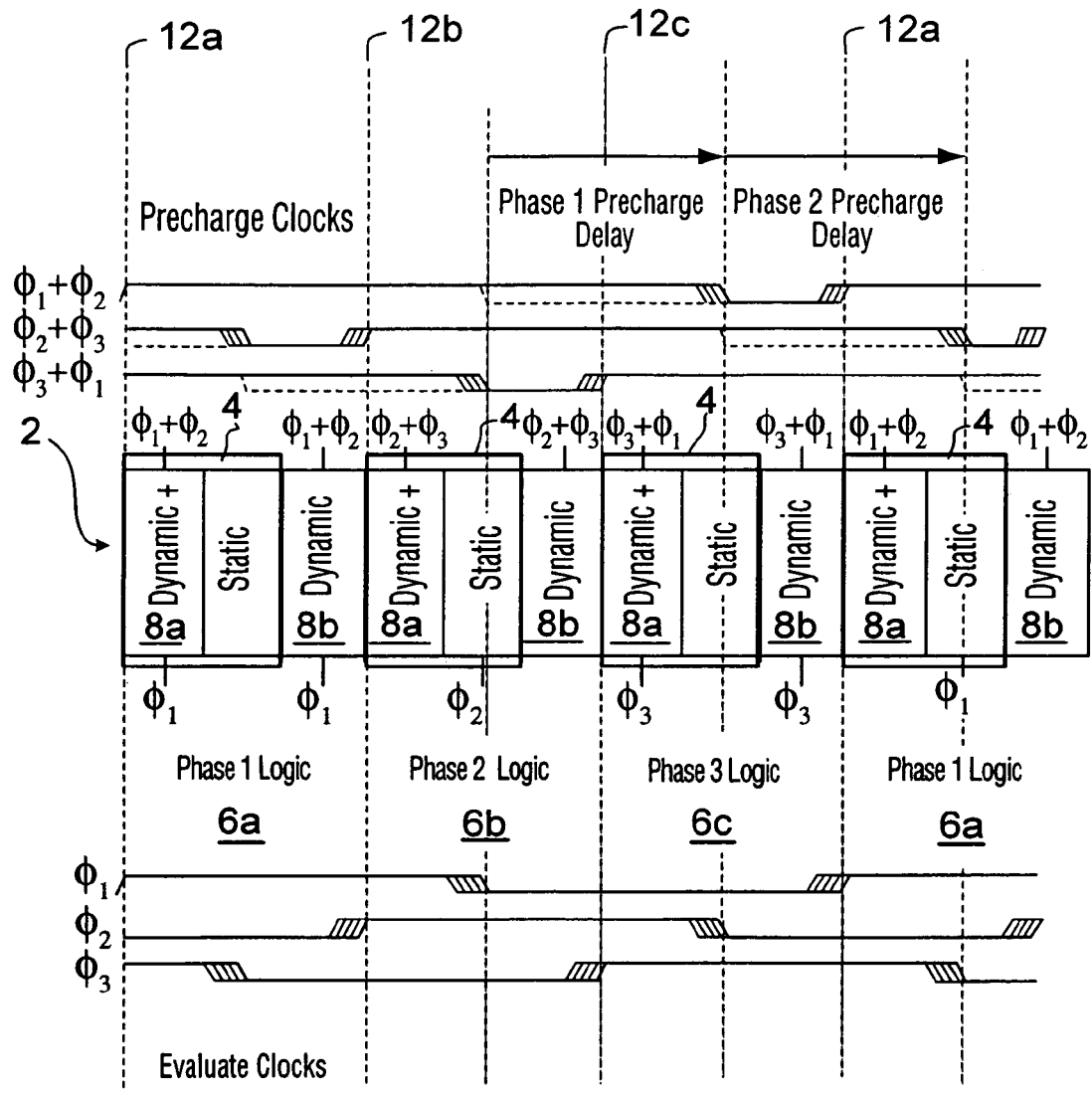
FIG. 7 schematically illustrates clock signals for driving a domino logic pipeline in accordance with a fifth embodiment of the present invention.

In the embodiment shown in FIG. 7, the "Dynamic+" gates 8a implement any of an input complemented function, a non-monotonic function, or a standard dynamic logic function. "Dynamic" gate 8b on the other hand implement a standard dynamic logic function.

Since this embodiment is based on OR-precharge/domino-evaluate, the equations described above for that embodiment apply. However, a system with only back-to-back dynamic gates across cell boundaries 12 will not support time-borrowing, as explained above, and all cells 6 will have a restricted logic evaluation time as described in (Equ. 1). However, for practical CL-domino pipelines, this logic style will often be used in combination with other CL-domino or skew-tolerant domino stages, that support time-borrowing across cells that require it.

Dynamic Cascaded Domino-Precharge/AND-Evaluate

Figure 8:
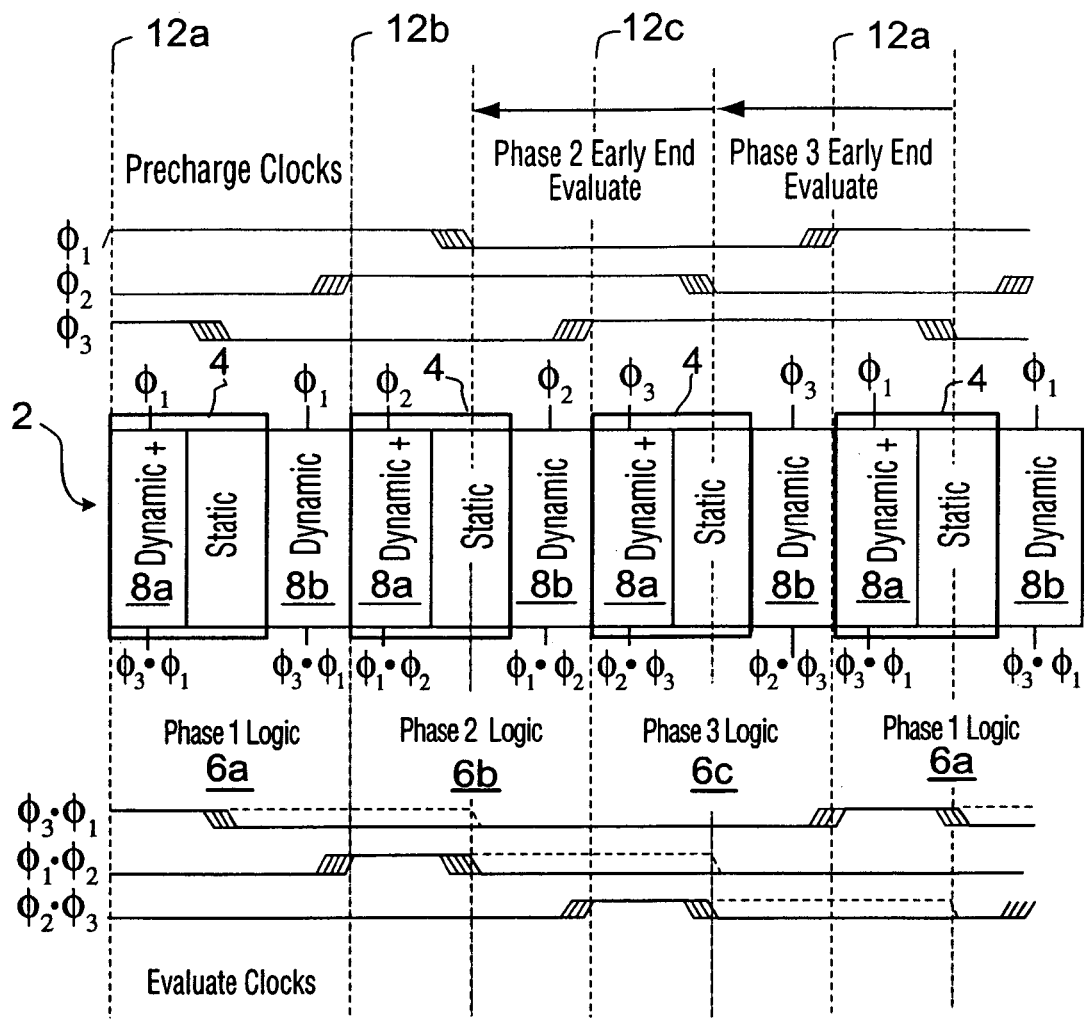
FIG. 8 schematically illustrates clock signals for driving a domino logic pipeline in accordance with a sixth embodiment of the present invention.

A directly cascaded version of AND-evaluate, where dynamic gates 8 are directly coupled back-to-back at cell boundaries 12 without an intervening static gate, can also be derived. Thus, a sixth embodiment of CL-domino, which uses AND-evaluate for all single-rail domino pipelines, is called "Dynamic Cascaded Domino-Precharge/AND-Evaluate" and is shown in FIG. 8.

In this embodiment, "Dynamic+ gates 8a implement any of an input complemented function, a non-monotonic function, and a standard dynamic logic function. "Dynamic" gates 8b on the other hand implement a standard dynamic logic function. Since this embodiment is based on domino-precharge/AND-evaluate described above, the equations described for that embodiment apply here. A system with strictly back-to-back dynamic gates 8 across cell boundaries 12, will support no time-borrowing and all cells 6 will have a restricted logic evaluation time as determined by the amount of guaranteed overlap between adjacent clock phases (Eq. 6). This is less than the evaluation time derived for dynamic cascaded OR-precharge/domino-evaluate. However, for practical CL-domino pipelines, this logic style will often be used in combination with other CL-domino or skew-tolerant domino gates that do support time-borrowing across phases and longer evaluation duty cycles.

Local Clock Generation at the Dynamic Gates

Logic functions of overlapping clock phases $\Phi$, $-\Phi_3$ can be implemented by clock logic circuits 14 of the dynamic gates 8 in CL-domino. Generating the required clocks at each dynamic gate 8 simplifies the clock distribution network, since fewer phases have to be distributed, and less inter-phase skew is introduced. Local clock functions are skew tolerant and also allow performance scaling of traditional skew-tolerant domino designs (and its variants such as OTB domino) without much design modification since the new clocks are implemented through an addition of a minimum number of transistors to a dynamic gate.

Clock Logic Formulas

A conventional N-type dynamic gate implements the logic function:

$$\text{Out}=\overline{\text{CLK}}+(\overline{BOOL})\cdot \text{CLK} \quad \text{(Equ. 11)}$$

Where BOOL is a non-inverting monotonic logic function. Note that conventional logic symbols are being used herein, in which "+" represents a logical OR, and "·" represents logical AND.

By using multiple clocks at a dynamic gate, different logical functions of the clocks can be used for precharge and evaluate operations. A Clock-Logic dynamic gate therefore implements the generalized function:

$$\text{Out}=\text{precharge condition}+\text{evaluate condition}+\text{state} \quad \text{(Equ. 12)}$$

The "state" exists for dynamic logic when the clocks for precharge and evaluate are different and the clocked transistors fully disconnect the gate 8 from Vdd and Vss. In this mode of operation, the gate 8 is neither precharging nor evaluating but instead holding its previous state much like an opaque latch.

For the Clock-Logic implementations described above, the dynamic gates 8 implement the following logic functions:

$$\text{Out}_{OR\ pre}=\overline{\text{CLK1}}\cdot\overline{\text{CLK2}}+(\overline{BOOL})\cdot\text{CLK1}+\text{state}\cdot\overline{\text{CLK1}}\cdot\text{CLK2} \quad \text{(Equ. 13)}$$

$$\text{Out}_{AND\ eval}=\overline{\text{CLK2}}+(\overline{BOOL})\cdot\text{CLK1}\cdot\text{CLK2}+\text{state}\cdot\overline{\text{CLK1}}\cdot\text{CLK2} \quad \text{(Equ. 14)}$$

$$\text{Out}_{OR\ pre\ AND\ eval}=\overline{\text{CLK2}}\cdot\overline{\text{CLK3}}+(\overline{BOOL})\cdot\text{CLK1}\cdot\text{CLK2}+\text{state}\cdot\overline{\text{CLK1}}\cdot\text{CLK2} \quad \text{(Equ. 15)}$$

$$\text{Out}_{OR\ pre\ OR\ eval} = \begin{cases} \overline{\text{CLK1}}\cdot\overline{\text{CLK2}}+(\overline{BOOL})\cdot\text{CLK1}+\text{state}\cdot\overline{\text{CLK1}}\cdot\text{CLK2} & : \text{first gate of cell} \\ \overline{\text{CLK1}}\cdot\overline{\text{CLK2}}+(\overline{BOOL})\cdot(\text{CLK1}+\text{CLK2}) & : \text{other gates of cell} \end{cases} \quad \text{(Equ. 16)}$$

$$\text{Out}_{dyn\ cascade\ OR\ pre}=\text{Out}_{OR\ pre} \quad \text{(Equ. 17)}$$

$$\text{Out}_{dyn\ cascade\ AND\ eval}=\text{Out}_{AND\ eval} \quad \text{(Equ. 18)}$$

Where CLK1 is a first clock phase, CLK2 is a next clock phase and CLK3 follows CLK2.

Clock Logic Domino Transistor Level Implementation

Figure 9:
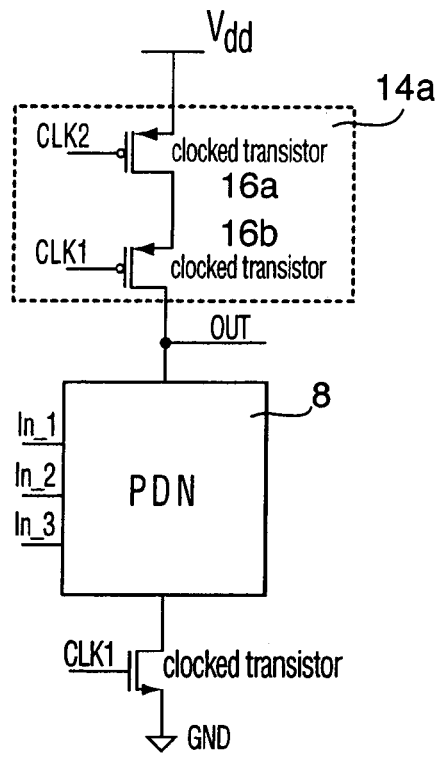
FIG. 9 schematically illustrates a dynamic gate with a clock logic circuit for implementing OR-precharge control in accordance with an embodiment of the present invention.
Figure 10:
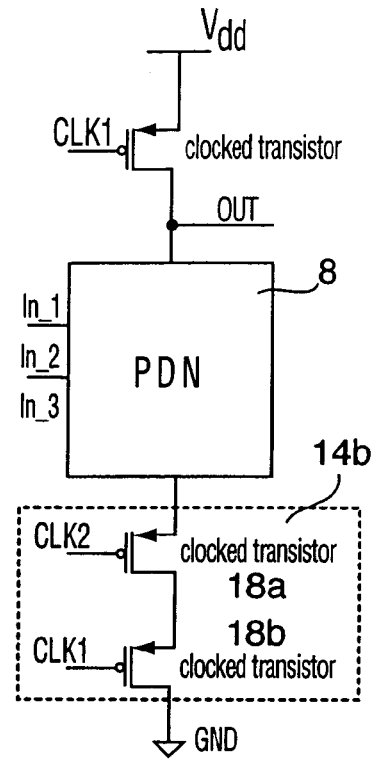
FIG. 10 schematically illustrates a dynamic gate with a clock logic circuit for implementing AND-evaluate control in accordance with an embodiment of the present invention.
Figure 11:
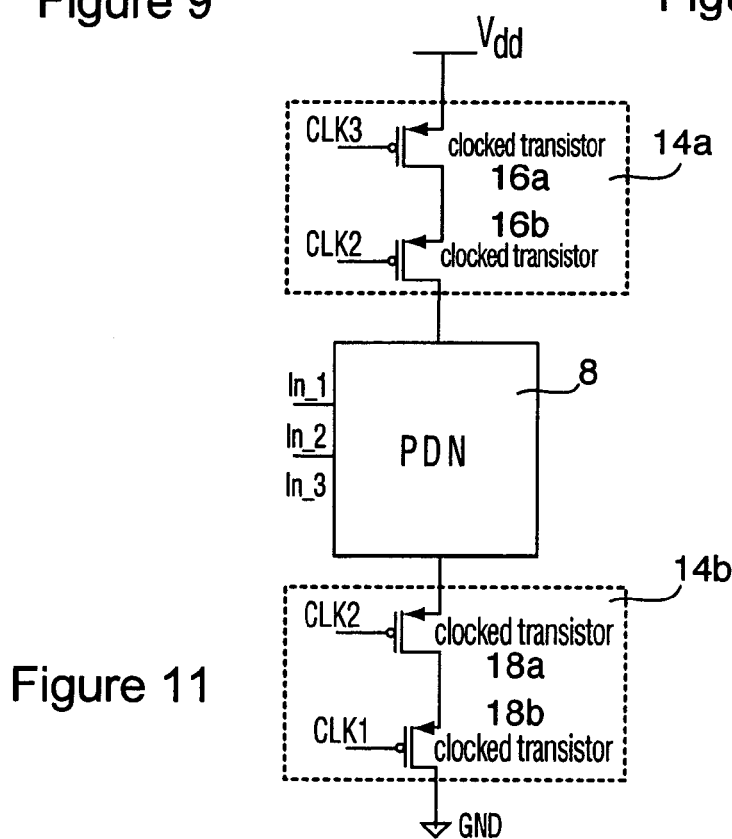
FIG. 11 schematically illustrates a dynamic gate with clock logic circuits for implementing OR-precharge/AND-evaluate control in accordance with an embodiment of the present invention.

Clock logic circuits 14 providing transistor level implementations of equations 13–15 are shown in FIGS. 9–11 respectively. Here, series P-MOS clock transistors 16 provide an OR-precharge clock logic circuits 14a, while series N-MOS clock transistors 18 provide an AND-evaluate clock logic circuit 14b.

Figure 12A:
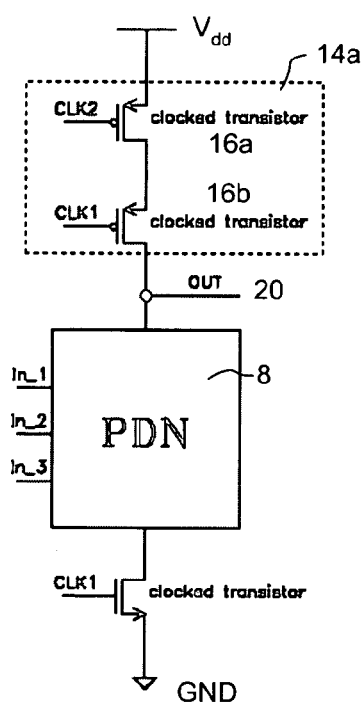
FIGS. 12*a* and 12*b* schematically illustrate clock logic circuits of first and second dynamic gates, respectively, of a logic phase implementing OR-precharge/OR-evaluate control, in accordance with an embodiment of the present invention.
Figure 12B:
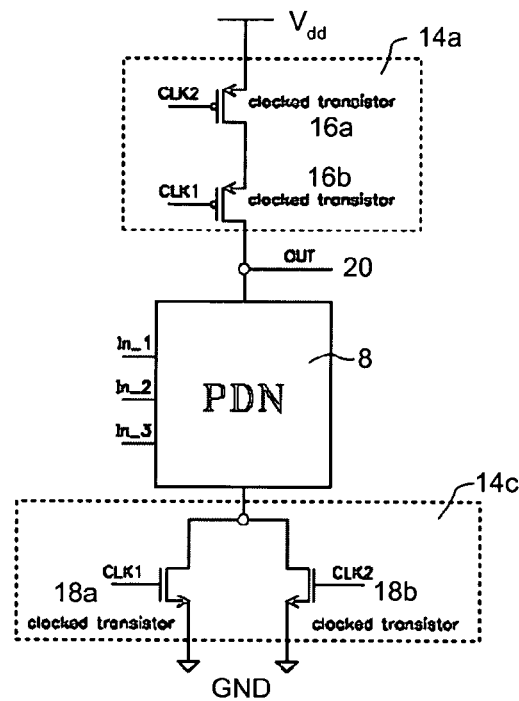

Clock logic circuits 14 providing a transistor level implementation of equation 16 is shown in FIG. 12a for the first gate 8 of each logic cell 6, while FIG. 12b shows the configuration used for the other remaining dynamic gates 8 in the cell 6. Here, series PMOS clock transistors 16 provide an OR-precharge clock circuit 14a while parallel NMOS clock transistors 18 provide an OR-evaluate clock circuits 14c. If desired, parallel PMOS clock transistors can be used to form an AND-precharge clock logic circuit (not shown).

Design Considerations for Series and Parallel Connections of Clock Transistors

Series connections of clocked transistors increases the resistance, while decreasing the conductance, from the Vdd supply-rail to the gate output node 20 for series PMOS and from the bottom of the logic network 8 to the Vss or ground supply-rail for series NMOS. Parallel connections of clocked transistors decreases the resistance, while increasing the conductance, when both transistors are on, while the resistance and conductance are unchanged from a single clocked transistor, when only one transistor is on. This is commonly the case when these circuits switch.

Series PMOS Clock Transistors

In the case of series PMOS clock transistors 16, the increased resistance will negatively affect the precharge time of the logic gate 8 unless the channel width of the PMOS transistors 16 is increased. This is made worse by the fact that OR-precharge allows less time for the precharge operation as discussed previously. Increasing the channel width, however, is detrimental to the clock load and hence the clock power of an OR-Precharge CL-domino gate. Furthermore, the parasitic load capacitance to the output node is also increased, thus reducing the gate's evaluate switching speed. Since PMOS transistors 16 have one-half to one-third the mobility of NMOS transistors 18, they must be sized even larger.

These design issues can be managed through selective placement of series PMOS transistors 16, which will be discussed in detail below. So long as the dynamic gate 8 can precharge within the shortened precharge cycle time, the overhead incurred through larger PMOS transistors 16 is small compared to the power savings and delay performance obtained from Clock-Logic domino compared to dual-rail skew-tolerant domino.

Series NMOS Clock Transistors

In the case of series NMOS clock transistors 18, the increased resistance will negatively affect the time it takes the logic gate to pull-down the output node 20 (logic evaluate time) unless the channel width of the NMOS transistors 18 are increased. This is compounded by the fact that AND-evaluate allows less time for the evaluate operation as discussed previously. Increasing the channel width, however, is detrimental to the clock load and hence the clock power of an AND-evaluate CL-domino gate. Since the height of the NMOS Pull-Down-Network (PDN) has now been effectively increased by one transistor, all the transistors of the NMOS stack should be increased to minimize circuit delay, as is common practice in digital CMOS circuits. This will negatively affect the circuit area, increase the effects of charge sharing, while increasing the output load of the logic gates that drive it.

These design issues can be managed through selective placement of stacked NMOS transistors which will be discussed in detail. As long as the dynamic gate 8 can evaluate within the shortened evaluate cycle time, the overhead incurred through larger NMOS transistors is small compared to the power savings and delay performance obtained for Clock-Logic domino compared to dual-rail skew-tolerant domino.

Parallel PMOS Clock Transistors

Parallel PMOS 16 clocked transistors have the effect of increasing the cycle time for precharge compared to that for evaluate. Since precharge for a stage of dynamic logic often occurs in parallel and evaluation occurs in series, increasing the precharge period is not normally required for CL-domino logic.

Parallel NMOS Clock Transistors

In the case of parallel NMOS clock transistors 18 shown in FIG. 12b, the decreased resistance, when both transistors are on, will increase the conductance from the bottom of the PDN to ground. Increasing the channel widths of the transistors will increase the PDN conductance even more while trading off increased clock load and clock power. However, the increased parasitic capacitance of the additional clock transistor cannot be ignored. Thus the increase in pull-down current is to some extent offset by the increase in parasitic capacitance of the clock transistor drains. When only one clock transistor is on, the pull-down current is the same as when only one clocked transistor is used. However, the drain node of the clock transistors will still be capacitively loaded by the off clock transistor, thus decreasing the switching speed of the logic gate. The decreased logic evaluate time is usually not appreciable.

Clock Input Ordering

Logic gates often have internal node capacitances that must be (dis)charged in addition to the output load. Because of this, the ordering of the clock transistors can affect the transient performance of CL-domino gates. Clock-Logic functions with two inputs are described below, although more inputs are feasible and the invention is not limited to CL-domino logic with two-input gates.

Series PMOS Clock Transistors

Figure 13:
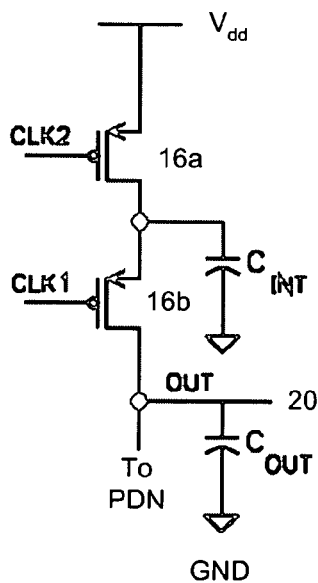
FIGS. 13–16 schematically illustrate respective exemplary transistor arrangements usable in the clock logic circuits in accordance with the present invention.
Figure 14:
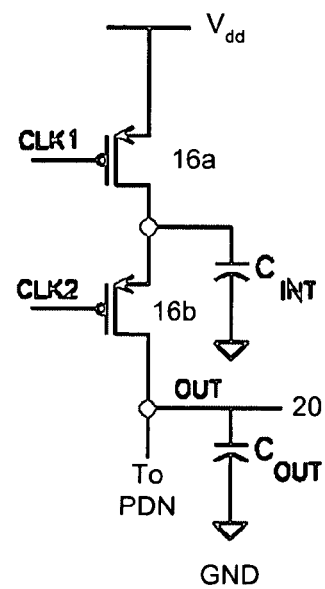

The ordering of the clock inputs for OR-precharge, can affect both the precharge and evaluate times of a CL-domino gate. The two options for the series connection of two PMOS clock transistors are shown in FIGS. 13 and 14, where CLK1 is a current phase clock, which rises $T_c/N$ before a later phase clock, CLK2.

The internal node capacitance, $C_{INT}$, has to be discharged along with the output capacitance $C_{OUT}$ during evaluation when the PMOS clock transistor closest to the output 20 is enabled. Since the size of the PMOS clock transistors 16 is larger than normal skew-tolerant domino, gates that are located early in a phase (after CLK1 rises and CLK2 is still low) can evaluate faster if the clock transistor of the current phase (in this case CLK1) is placed closer to the output node 20, as shown in FIG. 13. The capacitance that needs to discharged is equal to $C_{OUT}$, resulting in faster operation.

For CLK1 phase gates that evaluate while CLK2 is high, or alternatively when CLK1 logic is borrowing time from CLK2, the ordering of the clock transistors 16 does not affect the evaluate time. However, during the precharge period, the capacitance to charge can either be $C_{OUT}$ or $C_{OUT}+C_{INT}$. Therefore, when time borrowing into the next phase is expected, a gate precharges faster if the current phase clock (CLK1) transistor is placed closer to the supply rail, as shown in FIG. 14. This is because the internal node capacitance, $C_{INT}$, is already precharged by the time the next phase clock goes low and precharge of the output node begins. Hence the capacitance to be precharged is equal to $C_{OUT}$ during that period.

Series NMOS Clock Transistors

Figure 15:
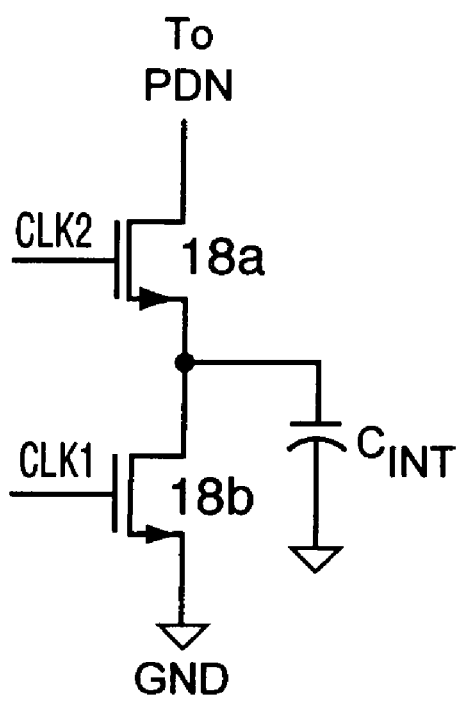

The ordering of the clock inputs for AND-evaluate, can affect the evaluate time, precharge time and noise tolerance of a CL-domino gate. The two options for the series connection of two NMOS clock transistors 18 are shown in FIG. 15 and FIG. 16, where CLK1 is a prior phase clock (CLK1) that rises $T_c/N$ before a current phase clock (CLK2).

The internal node capacitance, $C_{INT}$, has to be discharged in either case although it is possible to discharge $C_{INT}$ early. Since the size of the NMOS clock transistors 18 are larger than in normal skew-tolerant domino, CL-Domino AND-Evaluate gates can evaluate faster if the clock transistor 18 of the current phase clock (CLK2) is placed nearest the PDN, as shown in FIG. 15. This is because the internal node capacitance, $C_{INT}$ has predischarged by the time the current phase clock (CLK2) rises.

Figure 16:
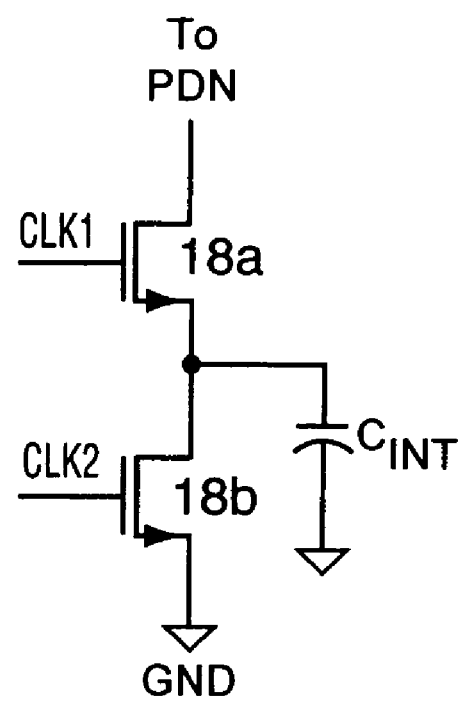
Figure 17:
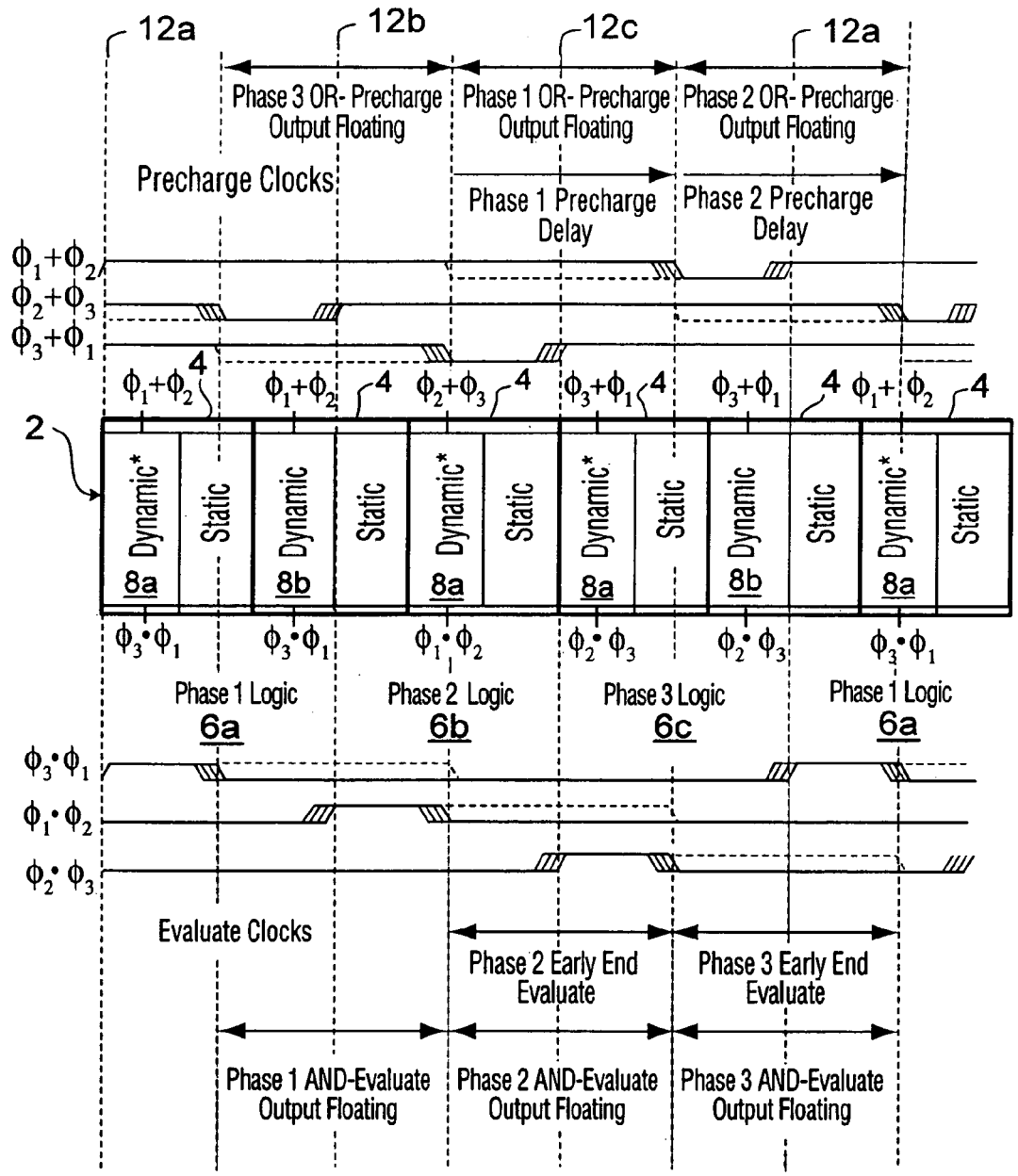
FIG. 17 schematically illustrates clock signals for controlling a floating-output operation of a clock-logic domino pipeline in accordance with the present invention.

Since gates clocked with AND-Evaluate can have charge sharing problems when a prior phase (CLK1) precharges, as described above, a gate can be made more robust to this type of charge sharing by placing the current phase clock (CLK2) transistor nearest to the ground-rail as shown in FIG. 16. This is because the internal node capacitance, $C_{INT}$, is disconnected from the PDN during a period that charge sharing can occur, while CLK1 is low and CLK2 is high. $C_{INT}$ is reasonably large even when compared to the output capacitance because of the increased height of the NMOS stacks and the increased sizes of the transistors thus making the gate more susceptible to charge sharing. Both OR-Precharge and AND-Evaluate have a time during the clock cycle where the output node is floating either high or low, as shown in FIG. 17. It is during this time that the gate is susceptible to charge sharing.

Keeper Design

In order to alleviate charge sharing and leakage currents, and to staticize the dynamic circuits during power saving clock stop, full keepers (not shown) should preferably be used on the outputs 20 of Clock-Logic dynamic gates 8. If keepers are used, they must contain both PMOS and NMOS feedback devices since the output node 20 can float either high or low. For more generalized CL-domino pipelines, as described below, full keepers should be used on every gate 8 that is clocked by OR-Precharge or AND-Evaluate. If maintaining circuit state during clock stop is the only concern, then only the dynamic circuits 8 of a chosen cell 6 need to include keepers.

The use of weak keepers slightly increases the diffusion capacitance to the output nodes of these dynamic gates. Furthermore, precharge and evaluate operations have to overcome a brief period of contention between the keeper transistors and the precharge and logic evaluation networks, respectively. Note that CL-domino systems clocked by "OR-Precharge/OR-Evaluate", do not require full keepers since the output can only float high. A half PMOS feedback device will suffice in this case.

Precharging Internal Nodes

Figure 18:
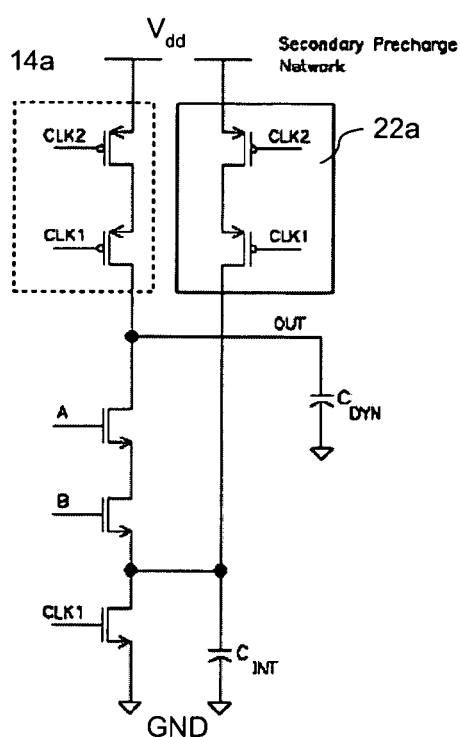
FIGS. 18–20 illustrates respective exemplary secondary precharge circuits in accordance with the present invention.
Figure 19:
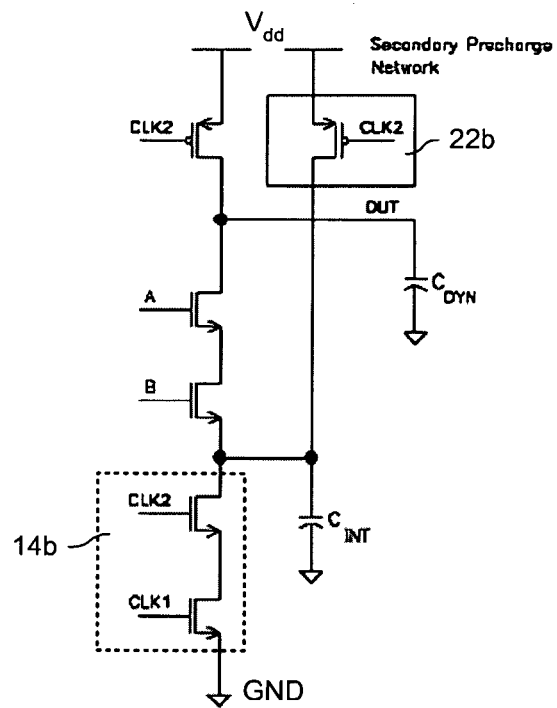

Precharging internal stack nodes is an effective method of dealing with charge sharing in dynamic circuits. For CL-domino logic, a secondary precharge network 22, used for precharging internal stack nodes, must have the same configuration as that used for the primary precharge network (clock logic circuit 14) as shown in FIGS. 18 and 19. This is because precharging the internal stacks in the same manner as in traditional dynamic logic may lead to the corruption of the output values because the gate 8 needs to maintain its state for a larger portion of the cycle than is the case with a single clock.

Figure 20:
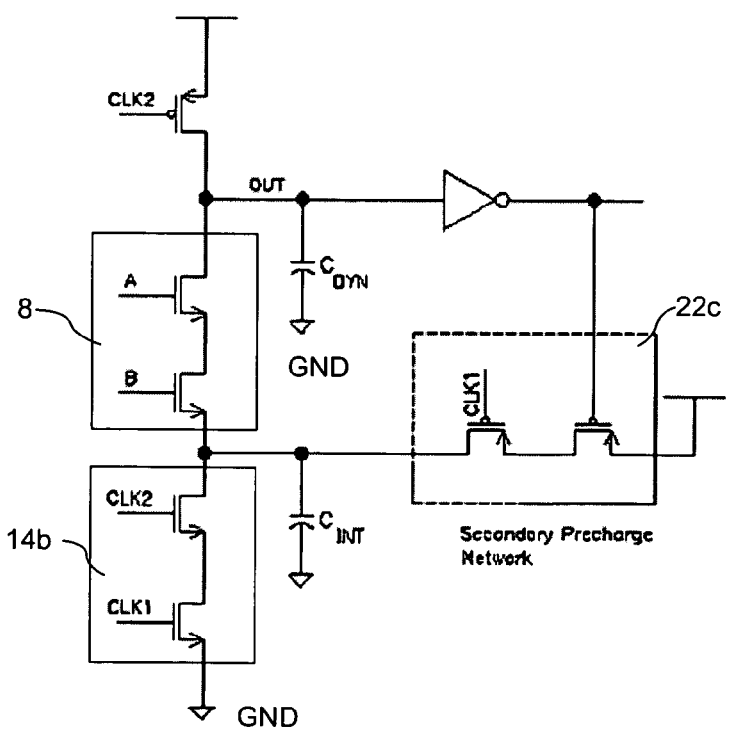

The method of AND-evaluate also presents problems with charge sharing when the previous cell precharges, as described above for gates that implement input complemented or non-monotonic logic. This problem cannot be solved with the precharging circuitry shown in FIG. 19 because the secondary precharge network is not enabled prior to a time when potential charge sharing occurs. A circuit that precharges internal nodes during this period is shown in FIG. 20.

The proposed circuit will not corrupt an evaluated low result on Out because the secondary precharge network 22*c* is conditionally activated only when the value of Out is evaluated high. In this case, precharge of the internal node $C_{INT}$ is desirable to avoid charge sharing. Furthermore, the circuit will initiate precharge of the internal node during the normal precharge period to circumvent charge sharing during evaluate, and thus can be used in place of the secondary precharge network 22*b* of FIG. 19.

Optimized Placement for OR-Precharge/AND-Evaluate CL-Domino

Exclusive use of CL-domino clocking for gates 8 that do not implement input complemented or non-monotonic functions may be detrimental to the switching speed and power dissipation of a dynamic pipeline 2. Therefore, a more general CL-domino methodology might integrate CL-domino OR-Precharge, AND-Evaluate, Dynamic Cascaded OR-Precharge and Dynamic Cascaded AND-Evaluate with normal skew-tolerant domino logic to achieve the fastest speed, lowest power dissipation and lowest area.

Note that "OR-Precharge/OR-Evaluate" is a CL-domino logic technique that cannot be incorporated with normal skew-tolerant domino. However, the extended evaluate duty cycle and increased opportunity for time borrowing for that logic style may offset any potential performance and power penalties incurred.

For generalized CL-domino, only those gates that implement input complemented or non-monotonic functions at a cell boundary 12 require more than one clock to be distributed to the dynamic gate. If OR-precharge is used, the last gate of the previous cell requires two series PMOS clock transistors, each driven by successive clock phases. The first gate of the current cell, that implements the input-complemented/non-monotonic function, and the subsequent gates of the cell can be clocked with single PMOS precharge transistors and single NMOS evaluate transistors, as in skew-tolerant domino logic. If AND-evaluate is used, the first gate of the current cell, that implements the input complemented/nonmonotonic function, requires two series NMOS clock transistors, each driven by successive clock phases. The subsequent gates of the current cell can be clocked with single PMOS precharge and single NMOS evaluate transistors as with skew-tolerant domino logic.

When an input complemented or non-monotonic function occurs in a domino pipeline, only one of OR-precharge and AND-evaluate is required. The remaining dynamic gates 8 of the input complemented/non-monotonic cell 6 and the gates 8 of cells 6 that implement normal monotonic output logic can be clocked with single PMOS precharge transistors and single NMOS evaluate transistors, thus increasing the switching speed of those gates and reducing the clock power. One very important property of this arrangement is that only the gates that use series transistors for precharge or evaluation need to follow the more stringent timing constraints for CL-domino logic while the remaining gates need to adhere to the less stringent timing constraints for skew-tolerant domino logic. This generalized method applies particularly well for non-footed dynamic gates to increase switching speed with no short circuit current, as will be described below.

Examples of cases where CL-domino and skew-tolerant domino gates adjacent each other within the same pipeline 2 are presented in Table 1 below. Here, a monotonic gate type describes a skew tolerant dynamic gate with a single precharge transistor and a single evaluate transistor.

TABLE 1

| Phase Position | Previous Gate Type | Current Gate Type | Next Gate Type |
|---|---|---|---|
| first | monotonic | monotonic | monotonic |
| | monotonic OR-pre | complemented domino eval | monotonic |
| | monotonic | complemented AND eval | monotonic |
| | complemented AND eval | monotonic | monotonic |
| | complemented domino eval | monotonic | monotonic |
| middle | monotonic | monotonic | monotonic |
| | complemented domino eval | monotonic | monotonic |
| | complemented AND eval | monotonic | monotonic |
| last | monotonic | monotonic | monotonic |
| | monotonic | monotonic | complemented AND eval |
| | monotonic | monotonic OR-pre | complemented domino eval |
| first = last | monotonic | monotonic | monotonic |
| | monotonic OR-pre | complemented domino eval | complemented AND eval |
| | monotonic | complemented OR-pre and AND eval | complemented domino eval |
| | monotonic OR-pre | complemented OR-pre | complemented domino eval |
| | monotonic | complemented AND eval | complemented AND eval |

Input Complemented or Non-Monotonic Gates in Two or More Consecutive Cells

When two or more consecutive logic cells contain input complemented or non-monotonic logic, the connections of the clocked transistors in the pipeline demonstrates a unique pattern.

If OR-precharge is used for the consecutive non-monotonic logic cells, the clocking scheme employed is that shown in FIG. 21. If AND-evaluate is used for the consecutive non-monotonic logic cells, the clocking scheme employed is that shown in FIG. 22. If OR-precharge is followed by AND-evaluate in consecutive non-monotonic logic cells, the clocking scheme is that as shown in FIG. 23.

Figure 24:
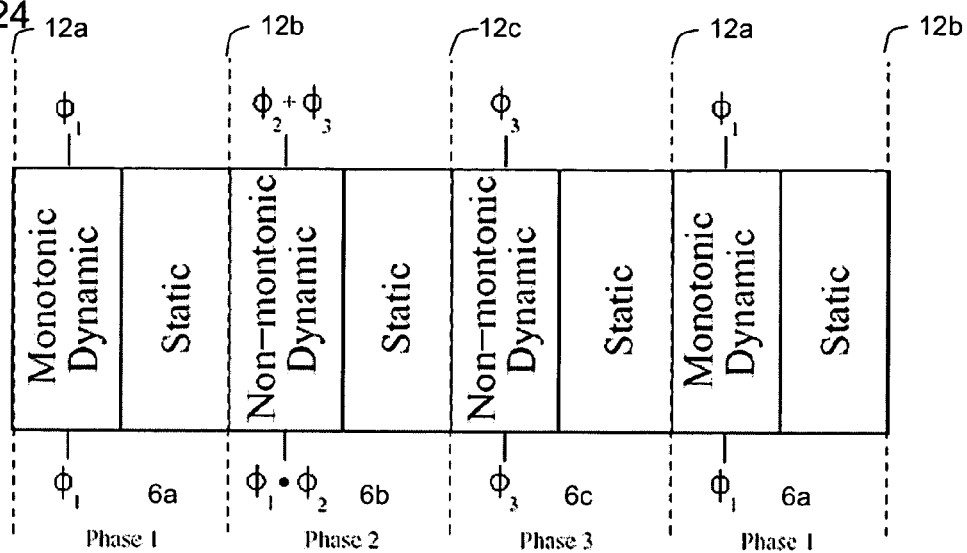
FIG. 24 schematically illustrates AND-evaluate followed by OR-precharge clock timing in consecutive phases of non-monotonic domino logic, in accordance with the present invention.

If AND-Evaluate is followed by OR-precharge in consecutive non-monotonic logic cells, the clocking scheme is that shown in FIG. 24.

Unfooted Gates

Figure 25:
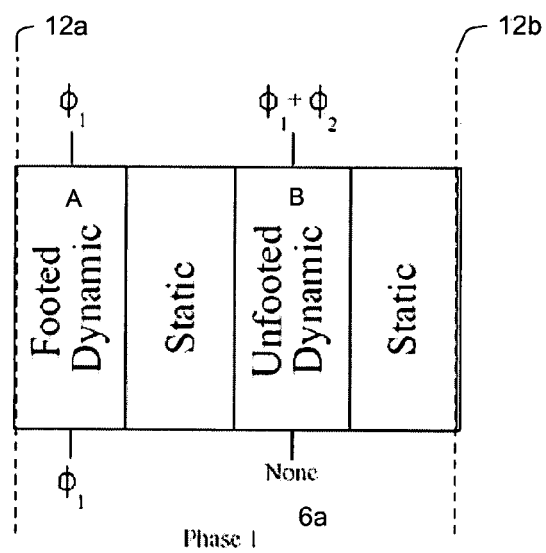
FIGS. 25–27 schematically illustrate clock timing for use of un-footed gates in a CL-domino pipeline in accordance with the present invention.

Unfooted gates can cause short circuit currents during the precharge operation since precharge to those gates occur in series rather than in parallel. An example of an unfooted gate in a CL-domino pipeline for high-speed operation is schematically illustrated in FIG. 25.

Normally the precharge delay of the footed dynamic gate (A) affects the short circuit current through the unfooted dynamic gate (B) since gate (A) must have flipped the value of its static gate from 1→0 before gate (B) can fully precharge to the rail voltage. Furthermore, since precharge now ripples, the precharge delay path must be considered as well since all the dynamic gates must have a high voltage on its output node when the evaluation phase begins. Using series PMOS transistors for the unfooted gate delays the onset of precharge so that gate (A) is fully precharged before gate (B) starts precharging thus eliminating short circuit current. Note that while gate (B) has to obey CL-domino precharge constraints, gate (A) only has to obey the relaxed precharge constraints of skew-tolerant domino. However, logic gate (A) should not take too long to precharge because it must finish precharge by the time $\Phi_1+\Phi_2=0$, which starts the precharge of gate (B) in order to avoid short circuit current.

Figure 26:
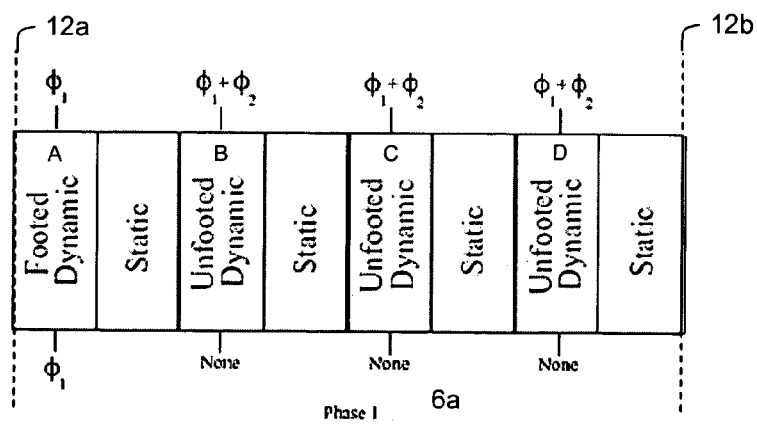
Figure 27:
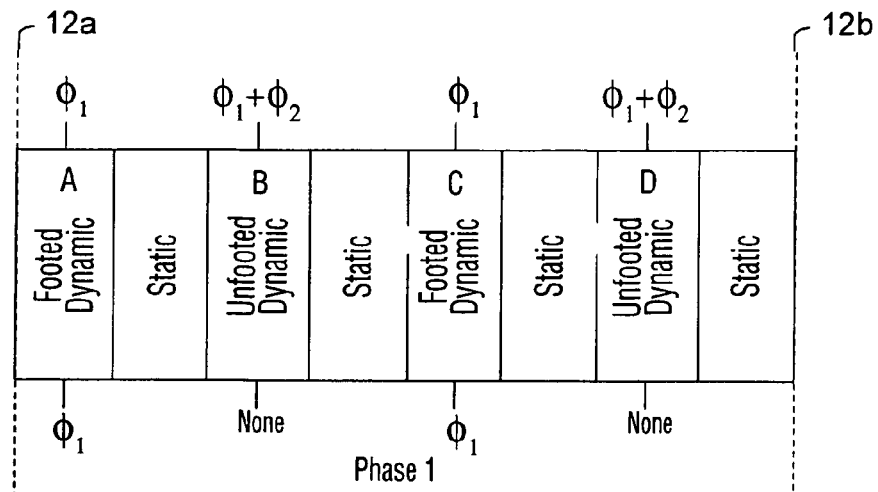

In unfooted domino pipelines with more unfooted gates per phase as schematically illustrated in FIG. 26, the unfooted gate, will draw short circuit current when its prior dynamic gate, precharges. One method to reduce short circuit current in this case is to delay the precharge clock to gate by the sum of the nominal evaluate delays of gate and its subsequent static gate. However, a better design alternative is to require a footed gate before any OR-precharge unfooted gate as schematically illustrated in FIG. 27. In this way all of the footed gates precharge when $\Phi_1$ is low, while the unfooted gates precharge when $\Phi_1+\Phi_2$ is low, hence eliminating short circuit current altogether while maintaining high speed.

Generalized CL-Domino Pipeline

Figure 28:
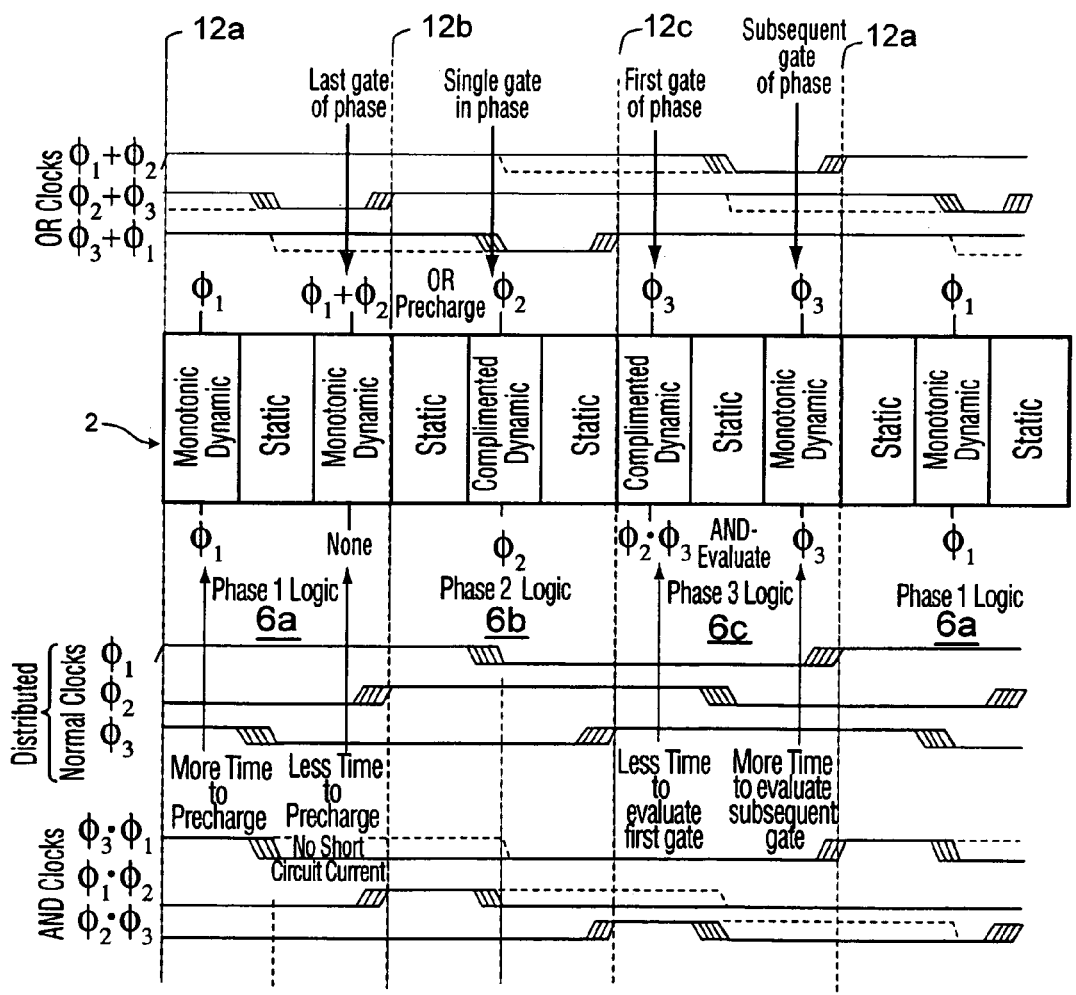
FIG. 28 schematically illustrates clock signals for controlling a generalized CL-domino pipeline in accordance with the present invention.

Clock control of a generalized CL-domino pipeline with selective placement of series connected PMOS and NMOS clock transistors is schematically illustrated in FIG. 28.

It is important to note that although there are nine sets of clocks shown for this pipeline 2, only three clocks (clocks $\Phi_1\Phi_3$) are actually distributed. All of the extra clocks are locally generated through appropriate precharge and evaluate clock logic circuits 14 (e.g. series PMOS and NMOS transistors) at the dynamic gates 8 themselves. This simplifies the clock distribution network considerably and makes the network less prone to skew and other clock uncertainties.

Local Clock Generators

In most high frequency digital systems, including microprocessors, a single global clock is distributed using either RC-matched trees or grids to minimize skew. Elements of tree networks include one-dimensional binary trees, H-trees, X-trees, geometrically matched trees, arbitrary trees, tapered trees, trunks, spines, and meshes. Moreover, pseudogrid-spine networks have been shown which combine trees and grids. Clock-logic domino, much like skew-tolerant domino, can use this same clock distribution scheme with a single global clock. Within each unit or functional block, well known local clock generators utilizing either delay elements or feedback clock generators, such as Delay-Locked-Loops (DLLs), can produce the required overlapping clock phases for CL-domino.

The simplest method of generating multiple overlapping clocks involves delay lines or delay chains. This method is adequate for most applications since the generated clocks are distributed only within local clock domains and therefore skew can be controlled to a high degree. A ⅓ cycle delay can be implemented with any even number of inverters, thus forming a non-inverting delay chain. In the general case, the amount of delay required is $T_c/N$ and N phases can be produced by delaying the clock with delay chains. Note that low-skew complement generators for complemented clocks are not required and hence no additional skew is introduced for those components.

A delay line tends to closely track the speed of critical paths to which it feeds. This is because the delay line will normally be located in close proximity to the clocked circuits and any variations in voltage, temperature, transistor orientation and processing will affect both the clock generator and clocked logic circuits equally, to a first order. Thus, Clock Logic domino is only sensitive to relative delays rather than absolute delays.

Lower skew and less duty cycle uncertainty can be achieved for CL-domino clocks using known feedback systems that track delays due to process and environmental changes. There are two common types of feedback systems which precisely generate local clocks from a globally distributed reference. The simpler of the two are delay-locked-loops (DLLs) while the more complicated are, from a loop architecture perspective, the phase-locked-loops (PLLs).

A global PLL distributes a single-phase global clock to multiple DLLs at different CL-domino functional units. This distribution scheme requires less area for clock wiring and is free of inter-phase skew at the global level, where clocks could run for several tens of millimeters. Each DLL loop receives the global clock and delays it by $T_c/N$, or ⅓ in this case, by adjusting the control voltage to the inverters so that the delay line has a full cycle delay. The delay line in this case is called a Voltage-Controlled-Delay-Line (VCDL). The feedback controller which nominally contains a phase detector, a charge pump and a loop filter, compensates for process and environmentally dependent frequency variations through modulating the delay line voltage. Normally, the time required to perform the compensation, or lock time in DLLs, is very short.

Recently; improved DLLs have been introduced which to a certain degree overcome some limitations of classical DLLs. These include limited delay ranges, loop-to-loop jitter, power consumption, and area penalty. However, there still exists a relatively large area penalty for CL-domino units that employ DLLs over those that employ delay lines. In addition, power requirements, which have recently become a problem in high frequency integrated circuits, and design complexity have to be balanced against any potential skew improvement and duty cycle invariability that DLLs offer. In future microprocessor designs, however, where skew might account for a larger portion of the clock cycle, DLLs may be required.

Clock-logic domino in accordance with the present invention provides an alternative to dual-rail domino for computing inverting and non-monotonic logic in a single-rail dynamic pipeline. This is accomplished by adding one to four clocked transistors to selected dynamic gates. Many of the benefits of skew-tolerant domino, such as immunity against clock skew and time borrowing to balance pipeline stages, are inherited for normal monotonic logic functions although the windows for skew tolerance are narrowed and non-time borrowing penalties exist for any complemented or non-monotonic function. If the timing guidelines for CL-domino are adhered to, a single rail domino pipeline can accomplish the same function as a dual-rail domino pipeline while minimizing power consumption, RC delays and area.

Simulation results for a CL-domino arithmetic and logic unit (ALU) at 1-GHz Under high skew (1-FO4) conditions, shows a power reduction of 41%, over the same ALU implemented in dual-rail skew-tolerant domino logic. This power reduction incurs no performance penalty with respect to dual-rail techniques.

The embodiment(s) of the invention described above is (are) intended to be exemplary only. The scope of the invention is therefore intended to be limited solely by the scope of the appended claims.

We claim:

1. A single-rail multi-gate domino logic circuit driven by a multi-phase clock, comprising:
a first dynamic logic stage comprising a precharge clock circuit comprising two p-mosfet transistors respectively driven by separate phases of the multi-phase clock;
a second dynamic logic stage comprising an evaluate clock logic circuit comprising at least one n-mosfet transistor respectively driven by a separate phase of the multi-phase clock; and
dynamic gates directly coupled back-to-back at cell boundaries without an intervening static gate and the domino logic circuit performs a dynamic cascaded OR-precharge/domino-evaluate function.

2. A single-rail multi-gate domino logic circuit driven by a multi-phase clock, comprising:
a first dynamic logic stage comprising a precharge clock circuit comprising two p-mosfet transistors respectively driven by separate phases of the multi-phase clock;
a second dynamic logic stage comprising an evaluate clock logic circuit comprising at least one n-mosfet transistor respectively driven by a separate phase of the multi-phase clock; and
dynamic gates directly coupled back-to-back at cell boundaries without an intervening static gate and the domino logic circuit performs a dynamic cascaded domino-precharge/AND-evaluate function.

3. A single-rail multi-gate domino logic circuit driven by a multi-phase clock, comprising:
a first dynamic logic stage comprising a precharge clock circuit comprising at least one p-mosfet transistor respectively driven by a separate phase of the multi-phase clock;
a second dynamic logic stage comprising an evaluate clock logic circuit comprising at least one n-mosfet transistor respectively driven by a separate phase of the multi-phase clock; and
a secondary precharge network comprising at least one p-mosfet transistor respectively driven by the separate phase of the multi-phase clock.

4. The domino logic circuit of claim 3 wherein the first dynamic logic stage comprises two p-mosfet transistors driven by separate phases of the multi-phase clock.

5. The domino logic circuit of claim 3 wherein the second dynamic logic stage comprises two n-mosfet transistors driven by separate phases of the multi-phase clock.

6. The domino logic circuit of claim 3 wherein:
the first dynamic logic state performs any one of:
an OR-precharge function;
a domino-precharge function; and
the second dynamic logic stage performs any one of:
an AND-evaluate function;
an OR-evaluate function; and
a domino-evaluate function.

7. A single-rail multi-gate domino logic circuit driven by a multi-phase clock, comprising:
a first dynamic logic stage comprising a precharge clock circuit comprising two p-mosfet transistors respectively driven by separate phases of the multi-phase clock;
a second dynamic logic stage comprising an evaluate clock logic circuit comprising at least one n-mosfet transistor respectively driven by a separate phase of the multi-phase clock; and
a secondary precharge network comprising two p-mosfet transistors respectively driven by the separate phases of the multi-phase clock.

* * * * *